United States Patent [19]

Lynch et al.

[11] Patent Number: 5,681,777
[45] Date of Patent: Oct. 28, 1997

[54] PROCESS FOR MANUFACTURING A MULTI-LAYER TAB TAPE SEMICONDUCTOR DEVICE

[75] Inventors: Brian Lynch, Milpitas; John McCormick, Redwood City, both of Calif.

[73] Assignee: LSI Logic Corporation, Milpitas, Calif.

[21] Appl. No.: 625,641

[22] Filed: Mar. 29, 1996

Related U.S. Application Data

[62] Division of Ser. No. 451,561, May 26, 1995, abandoned, which is a continuation of Ser. No. 894,031, Jun. 4, 1992, abandoned.

[51] Int. Cl.$^6$ .............................. H01L 21/58; H01L 21/60
[52] U.S. Cl. .................... 437/182; 437/206; 437/216; 437/217; 437/220
[58] Field of Search .................... 437/182, 216, 437/217, 206, 220

[56] References Cited

U.S. PATENT DOCUMENTS

| | | | |
|---|---|---|---|
| 4,308,339 | 12/1981 | Lindberg | 430/312 |
| 4,771,330 | 9/1988 | Long | 357/80 |
| 4,800,419 | 1/1989 | Long et al. | 357/70 |
| 4,842,662 | 6/1989 | Jacobi | 156/633 |
| 4,933,741 | 6/1990 | Schroeder | 357/70 |
| 4,965,702 | 10/1990 | Lott et al. | 361/401 |
| 4,972,253 | 11/1990 | Palino et al. | 357/74 |
| 5,023,202 | 6/1991 | Long et al. | 437/206 |
| 5,051,813 | 9/1991 | Scheider et al. | 357/72 |
| 5,300,481 | 4/1994 | O'Neill et al. | 504/284 |

FOREIGN PATENT DOCUMENTS

| | | | |
|---|---|---|---|
| 55-24479 | 2/1980 | Japan | 257/666 |
| 56-155540 | 12/1981 | Japan . | |
| 57-75450 | 5/1982 | Japan . | |
| 63-232436 | 9/1988 | Japan . | |

*Primary Examiner*—David E. Graybill
*Attorney, Agent, or Firm*—Townsend and Townsend and Crew LLP

[57] ABSTRACT

One or two, or more, additional conductive layers, separated from one another (if two or more) and separated from a patterned (signal) conductive layer are formed in a flexible substrate, for mounting a semiconductor die in a semiconductor device assembly. These additional layers are used as separate planes for carrying power and/or ground from outside the assembly to the die, on a separate plane from signals entering or exiting the die. TAB processes are disclosed for cutting, bending and bonding inner and outer portions of selected signal layer traces to respective inner and outer edge portions of the additional conductive layer(s), including a two-stage process of (1) first cutting, bending and tacking the selected traces to the additional layer(s), and then (2) repositioning a bonding tool and securely bonding the selected traces to the additional layer(s). A tool (die pedestal) for aiding in the assembly process is also disclosed.

9 Claims, 13 Drawing Sheets

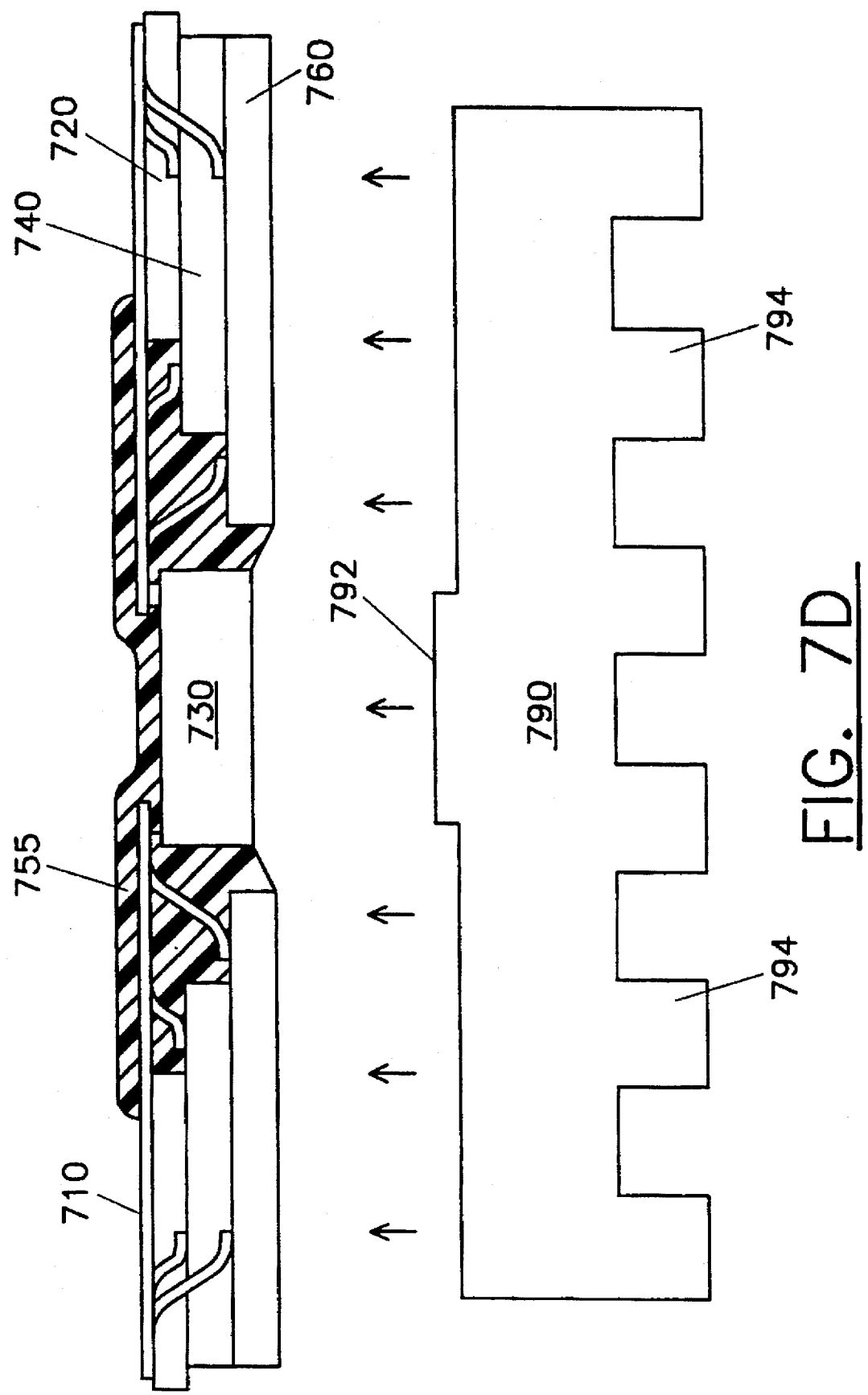

PROCESS FOR MANUFACTURING A MULTI-LAYER TAB TAPE SEMICONDUCTOR DEVICE

This is a continuation application of U.S. patent application Ser. No. 08/451,561, filed May 26, 1995, by Brian Lynch and John McCormick, now abandoned, which is a continuation application of. U.S. patent application Ser. No. 08/894,031, filed Jun. 4, 1992, now abandoned.

TECHNICAL FIELD OF THE INVENTION

The invention relates to mounting a semiconductor device, or integrated circuit (IC) to a lead frame, flexible lead frame, or tape, for final packaging.

BACKGROUND OF THE INVENTION

Generally speaking, there are three distinct techniques of packaging a semiconductor device, in any case said package having leads or the like exiting the package for electrically connecting the packaged die to other components, either by mounting directly to a printed circuit board or by plugging the packaged device into a socket which, in turn is mounted to a printed circuit board. These are: (1) plastic molding; (2) ceramic packaging; and (3) flat packing.

U.S. Pat. No. 5,051,813 (Schneider, et al.), incorporated by reference herein, provides an example of a plastic-packaged semiconductor device. Present plastic packaging techniques involve molding a plastic "body" around a semiconductor die. Prior to molding, the die is attached to a lead frame having a plurality of leads ultimately exiting the package for connecting the semiconductor device to external circuits, such as via conductors on a printed circuit board. Various forms of plastic packs are known, including DIP (Dual In-line Package), PQFP (Plastic Quad Flat Pack) and PLCC (plastic leaded chip carrier). The lead frame is formed from a single thin layer (foil) of conductive material, which is punched out to form individual leads. The inner ends of the leads are usually wire bonded to the active side (components, bond pads) of the die. When handling the lead frame, prior to encapsulation, it is exceptionally important to avoid damaging the closely-spaced, delicate leads.

U.S. Pat. No. 4,972,253, incorporated by reference herein, provides an example of multi-layer ceramic packages which are laminated structures of alternate conducting and nonconducting layers, formed of thick conductive film and nonconductive ceramic, respectively. Generally, the conductive layers carry only one of signals, power or ground. This approach, particularly separating the signal plane (layer) from the ground and power planes, has distinct electrical advantages, which are well known. In this type of package, the conductive layers are screened or otherwise disposed between the nonconductive layers, and a very rigid, stable package is formed. For the signal-carrying layers, lead traces are typically screened onto an underlying ceramic layer. A die is eventually disposed into an opening in the package and connected to inner (exposed) ends of the lead traces. Generally, there is little problem in damaging the lead traces, since they are well supported by an underlying ceramic layer. Generally, vias are formed in the package to connect power and ground planes to particular leads in the signal plane.

U.S. Pat. No. 4,965,702, incorporated by reference herein, provides another example of a multi-layer package, using polymeric (e.g.) insulating layers and a copper foil (e.g.) for the conductive layers. Again, an object of such a multi-layer package is to provide for an electrical multilayer conductive package which partitions (separates) the power supply system of the package from the signal transmission system as much as practical in order to optimize the performance of both.

These two multi-layer ceramic and polymer packages are also known as "chip carriers". Both are preferably completely formed prior to mounting the semiconductor die within an opening in the chip carrier, and in both the inner leads are well-supported. Hence, both of these chip carriers inherently avoid the problem of lead damage during handling and mounting of the die.

FIGS. 1A and 1B show an example of tape-based flat packing. As illustrated herein, a semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. It is also known to employ conductive "bumps" on the inner ends of the leads, rather than bond wires, to connect the leads to the semiconductor die 22, in a tape automated bonding (TAB) process. The upper and lower plastic layers are suitably formed of polyimide, and form a thin, insulating supportive structure for the leads 18. A square, insulating ring ("body frame" or "dam") 26 is disposed atop the leads 18 between portions 148 and 14C of the upper plastic film layer, outside the die area. A layer-like quantity of silicone gel 28 is disposed over the die 22 and bond wires 24, and acts as an ionic contamination barrier for the die and as a stress relief for the leads 24 during assembly of the semiconductor device assembly, and further prevents an ultimate encapsulation epoxy 30 from contacting the semiconductor die. Evidently, the inner ends of the leads 18 are very fragile, and extreme care must be exercised when assembling the die 22 to the leads 18. In this respect, tape mounting a semiconductor die requires a similar degree of extreme care when mounting the die to the fine-pitch conductive leads.

Further examples of mounting semiconductor devices to a tape structure are shown in U.S. Pat. Nos. 4,800,419 and 4,771,330, incorporated by reference herein.

As used herein, the term "semiconductor device" refers to a silicon chip or die containing circuitry and bond sites on one face, and the term "semiconductor device assembly" refers to the semiconductor chip and associated packaging containing the chip, including external package leads or pins for connecting the semiconductor device assembly to a socket or a circuit board, and including internal connections (such as bond wires, TAB, or the like) of the chip to inner ends of the leads.

The aforementioned patents relate to semiconductor device assemblies having a high lead count, which is "de rigueur" in modern semiconductor devices. The plastic packaging and tape mounting techniques are generally indicative of methods of mounting semiconductor devices to preformed lead frames having a plurality of extremely delicate conductors connecting to the die.

As mentioned above, there are generally two techniques for connecting a die to inner ends of lead frame conductors, namely wire bonding and tape-automated bonding (TAB). In TAB, "bumps" typically formed of gold, are located on either the die ("bumped die") or on the inner ends of the lead fingers ("bumped tape"). See, e.g., U.S. Pat. No. 4,842,662, FIGS. 5 and 6, respectively.

U.S. Pat. No. 4,842,662, incorporated by reference herein, discloses bonding integrated circuit components directly to a TAB tape, without the intermediary of a gold bump, by use of a process employing ultrasonic energy, pressure, time, heat and relative dimensions of the TAB tape. Generally, the end of a lead is "downset" (urged down) onto a die. (See column 6, lines 5–8) This may be thought of as a "bumpless" TAB process.

While the above-referenced patents teach various techniques of forming lead frames, TAB tapes, and the like, and various techniques for connecting semiconductor dies to same, these techniques generally involve only one layer, or plane, of patterned metal conductors (lead fingers), which single conductive layer is represents a single plane carrying signals, power and ground to the semiconductor die.

As mentioned hereinabove, it is electrically desirable to provide distinct planes for carrying signal, power and ground from leads (or pins) exiting the package to the die within the package.

U.S. Pat. No. 4,933,741, incorporated by reference herein, discloses a multilayer package for integrated circuits having a ground plane (20) electrically isolated from a plane of conductors (14) by means of an insulating layer (16) formed of polyimide. The ground plane (20) is connected to selected conductors (14) by means of vias (18) extending through the insulating layer (16). The remaining (non-grounded conductors) carry signals and power to/from the integrated circuit device (11). As pointed out therein, "[b]ecause of the small physical size of the electrical conductors 14, they represent a significant impedance to operating potential and current 15 applied to the integrated circuit 11 causing an undesirable voltage drop along the length of the conductors 14. Additionally, capacitive coupling between the conductors 14 causes cross talk on the conductors 14 which apply signals to and/or derive signals from the integrated circuit 11. Further, the impedance of the conductors 14 create switching noise when the DC operating current 15 applied to the integrated circuit varies." And, as noted therein, "the capacitive cross coupling between the conductors 14 can be reduced by a [separate] ground plane 20 which also surrounds the integrated circuit 11 and is located adjacent the plurality of conductors." (See, especially, column 2, lines 31–46)

Despite the generally accepted notion that providing a separate ground plane has desirable electrical characteristics, the examples set forth above are limited to rigid, multi-layer ceramic or polyimide or polymer chip carriers. In both of these multi-layer approaches, it is relatively feasible to provide vias between separate metal layers and the intervening insulating layers.

On the other hand, in a tape-mounted, flexible substrate, semiconductor device assembly, it has generally not been very practical to consider or implement incorporating a distinct ground plane, since this type of "flexible" packaging does not lend itself readily to such a multi-layer approach employing vias spanning insulating layers.

For example, commonly-owned, copending U. S. patent application Ser. No. 07/829,977 abandoned, entitled RIGID BACKPLANE FOR SEMICONDUCTOR DEVICE ASSEMBLY, filed on Jan. 31, 1992, by Michael D. Rostoker, discloses an integrated circuit device package (semiconductor device assembly) having a flexible substrate including an upper patterned insulative layer, and a lower patterned conductive layer including a plurality of package leads (lead fingers). The assembly further includes a rigid or semi-rigid lower protective layer, formed of ceramic, glass, metal, plastic, and combinations thereof, which provides enhanced protection from mechanical and electrical degradation of the packaged device, and which may also serve as a heat sink.

Hence, we see that there are at various desirable and unfulfilled objectives in the design and implementation of tape-mounted, flexible-substrate semiconductor device assemblies.

DISCLOSURE OF THE INVENTION

It is an object of the present invention to provide an improved semiconductor device assembly.

It is a further object of the present invention to provide a multi-layer, relatively-flexible, tape-like substrate for mounting a semiconductor device, said substrate having at least a signal layer distinct from at least a ground plane.

It is a further object of the present invention to incorporate at least one additional electrically conductive plane into a semiconductor device assembly using tape automated bonding (TAB) assembly techniques.

It is a further object of the present invention to provide a rigid supportive structure in a TAB package.

It is a further object of the present invention to provide an improved technique for manufacturing a semiconductor device assembly.

It is a further object of the present invention to provide tooling for practicing the inventive techniques disclosed.

According to the invention, a relatively-flexible, tape-like substrate for mounting a semiconductor device has a patterned, conductive layer of fine-pitch leads extending into a central area in which a semiconductor die may be connected to the inner ends of the leads. The substrate includes an underlying insulating (e.g., plastic film) layer supporting the leads, with an opening larger than the area defined by the inner ends of the leads so that inner end portions of the leads remain exposed past the opening in the insulating layer for connecting the leads to the semiconductor device. Preferably, all of the leads are connected to the semiconductor device.

A second, additional conductive layer underlies the insulating layer and is not patterned to form distinct leads, but rather forms a planar ring-like layer, the inner edge of which extends past the opening in the insulating layer, but is larger than the die. Hence, the substrate can be viewed as a sandwich of two conductive layers, one of which is patterned into discrete conductors (traces) and the other of which is not patterned, and an insulating layer interposed between the two conductive layers.

According to the invention, a first group (portion) of the total number of lead traces in the patterned conductive layer are connected to the die, preferably by TAB bonding or similar process (i.e., rather than by wire bonding). A remaining, selected portion of the lead traces in the patterned conductive layer are also connected at their inner ends to the die, and are then: (1) broken off at or just within the edge of the opening in the insulating layer, leaving an inner end portion of the selected lead traces disconnected from the remaining portion of the selected lead traces, one end of the inner end portion bonded to the die and the other end of the inner end portion being a "free" end, and are then (2) bent downwards past the insulating layer so that the free ends of the inner end portions of the traces contact an inner edge portion of the additional conductive layer extending into the opening of the insulating layer, and are then (3) bonded at their free ends to the inner edge portion of the ring. In this manner, the additional conductive layer can act as a ground (or power) plane connected to the die.

The additional conductive layer also extends under window-like slits near the outer edges of the insulating layer, where a similar process of cutting, bending and bonding outer portions of the selected lead traces to an outer edge portion of the additional conductive layer is performed. In this manner, external portions of the selected lead traces, beyond the outer portions, exit the ultimate semiconductor device assembly, and can be connected to external ground (or power).

Hence, the additional conductive layer can be used to conduct ground (or power) from external portions of the selected lead traces to inner end portions of the lead traces, to the die, bypassing on a different plane the remaining intermediate portions of the lead traces which are intended (primarily) to carry signals to and from the die. In this manner, a distinct ground (or power) plane is established which is isolated from the patterned conductive layer (primarily signal paths), and the beneficial electrical characteristics discussed above accrue to a flexible, tape-mounted semiconductor device assembly.

Further according to the invention, two additional conductive layers are formed, one for ground and one for power. In a manner similar to that set forth with respect to one additional conductive layer, selected leads are cut, bent and connected to inner and outer edge portions of one additional conductive layer, and selected other leads are cut, bent and connected to inner and outer edge portions of the second additional conductive layer.

Further according to the invention, the selected and other selected lead traces are cut at an edge of the insulating (plastic) layer between the patterned conductive layer and the first additional (or simply "additional" if only one) conductive layer by urging downward on the selected and selected other lead traces with a bonding tool.

Further according to the invention, in a first bonding step, a bonding tool is used to cut, bend and partially bond a free end of the selected and selected other (if applicable) traces to the first and second (if applicable) additional conductive layers. In a second bonding step, the bonding tool is repositioned and bonds the already stabilized (tacked to the additional layer) free end of the lead trace to the additional conductive layer.

Further according to the invention, various methods of TAB bonding a conductive trace to an additional conductive layer, avoiding the use of vias, is disclosed.

Further according to the invention, various bonding tools for effecting TAB bonding of lead traces to an additional conductive layer are disclosed.

Further according to the invention, a tool (die pedestal) for aiding in the assembly of the die to the tape substrate, and for aiding in cutting, bending and bonding the selected and selected other lead traces to the additional conductive layer (s) is disclosed.

Other objects, features and advantages of the invention will become apparent in light of the following description thereof.

BRIEF DESCRIPTION OF THE DRAWINGS

FIGS. 7A–7D are cross-sectional views of heat sink options for the semiconductor device assemblies of the present invention (e.g., as shown in FIGS. 3A and 4A).

DETAILED DESCRIPTION OF THE INVENTION

Figure 1A:
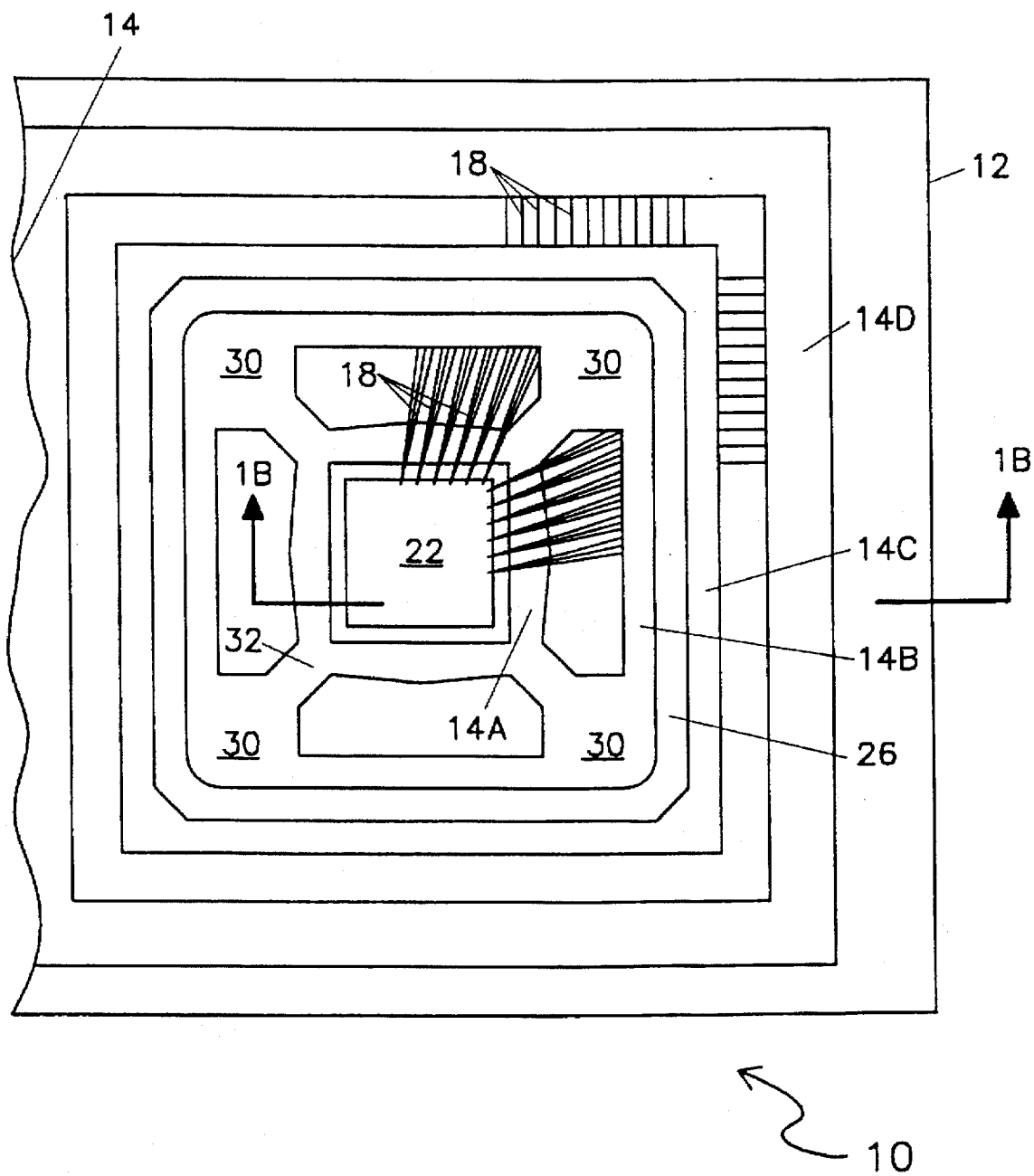
FIG. 1A is a plan view of a prior art technique of tape-mounting a semiconductor device to a flexible substrate.
Figure 1B:
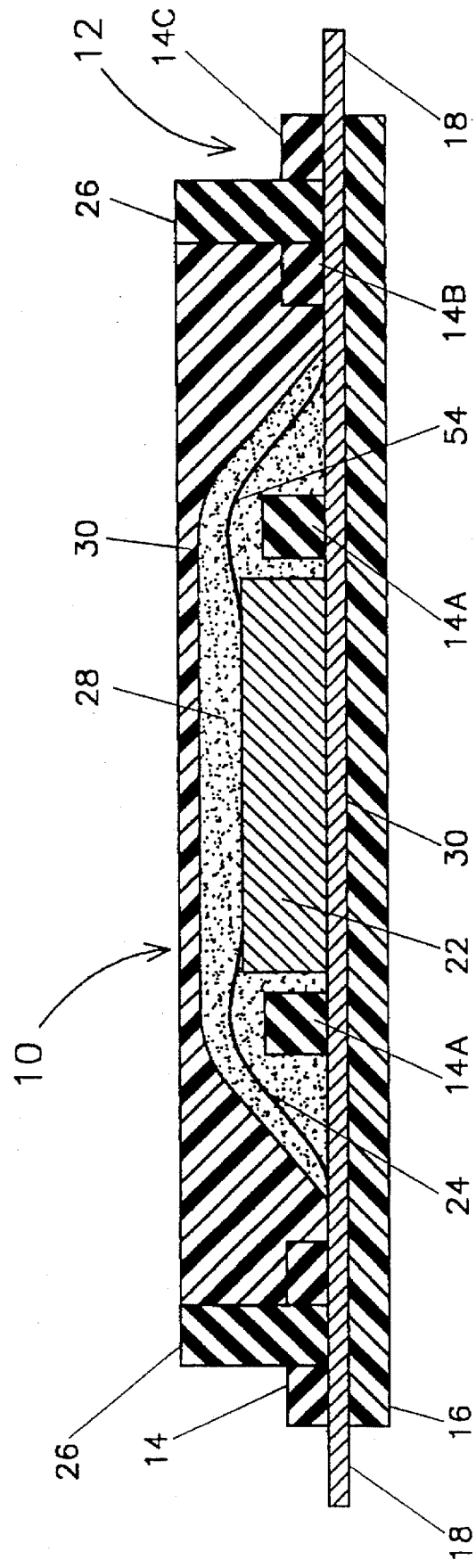
FIG. 1B is a cross-sectional view of the prior art technique of FIG. 1A, taken on a line 1B—1B through FIG. 1A.

FIGS. 1A and 1B show a prior art technique of tape-mounting a semiconductor device to a flexible substrate. As discussed above, a semiconductor die can be wire bonded, or TAB mounted to the inner ends of the conductive leads (traces).

Figure 2A:
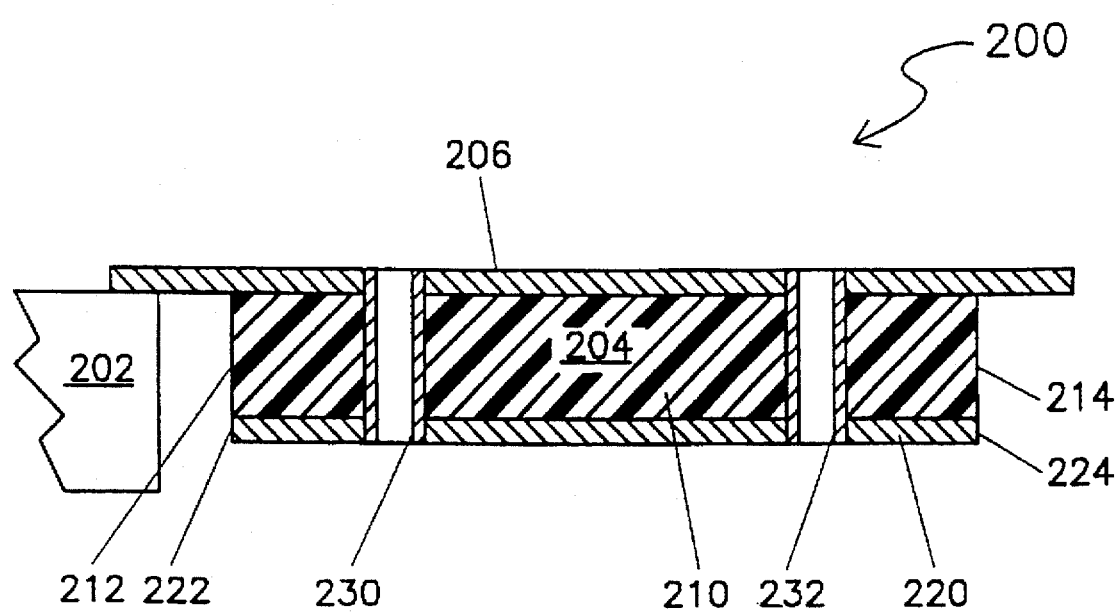
FIG. 2A is a cross-sectional view of a prior art technique of forming a two-metal-layer, TAB-type semiconductor device assembly, using vias to connect the two metal layers together.
Figure 2B:
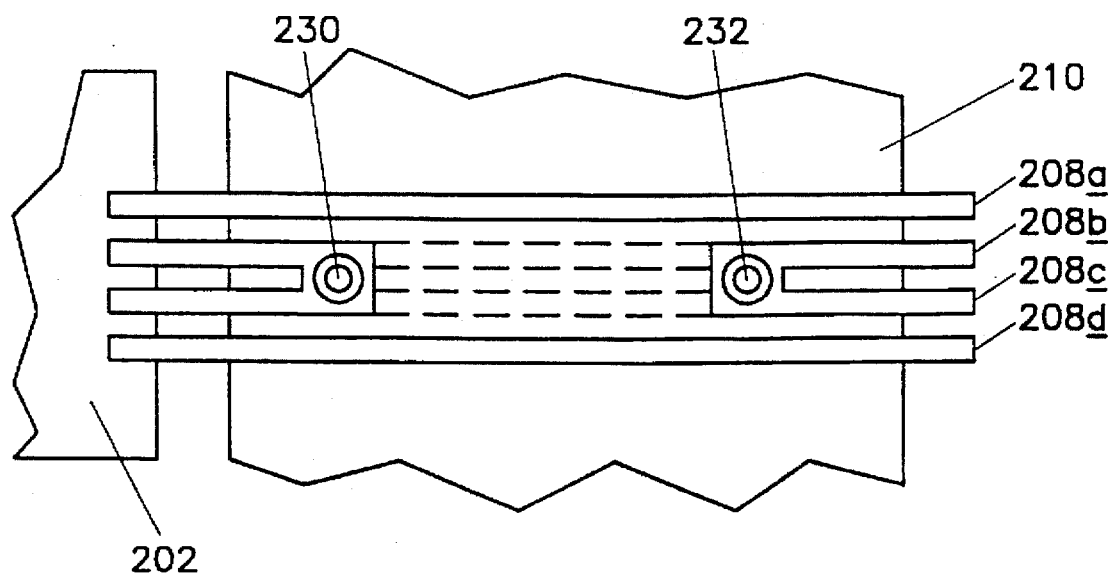
FIG. 2B is a top plan view of a portion of the assembly of FIG. 2A.

FIGS. 2A and 2B show another prior art technique 200 of tape-mounting a semiconductor die 202 to a flexible substrate 204. In this example, the substrate has first metal layer 206, such as copper foil, patterned with conductive lines (traces) 208. These traces 208 are very fine pitch to meet the signal input/output (I/O) demands of modern, complex semiconductor devices. Only four traces 208a, 208b, 208c and 208d are shown (see FIG. 2B), as representative of the hundreds of such traces typically required. These traces 208 extend from an outer end (right, as viewed in the Figures) where they will connect to external sources and circuitry, to an inner end (left, as shown) where they are bonded to the die, and usually each trace (e.g., 208a, 208b, 208c and 208d) carries a distinct I/O signal, or power or ground.

As is known, the first metal layer 206 of traces 208 is suitably supported by an underlying layer 210 of an insulating material, such as polyimide film. The insulating layer 210 is provided with a central opening 212, formed by an inner peripheral edge thereof. The first metal layer traces 208 extend into the opening, a suitable distance for bonding to the die. The first metal layer traces 208 also extend beyond the outer edge 214 of the insulating layer for connection to external circuits and systems.

The substrate 204 is also provided with a second metal layer 220, on an opposite side of the insulating layer 210 from the first metal layer 206. The second metal layer 220 is not patterned to form traces, but is rather a planar ring-like structure having an inner edge 222 aligned with the inner edge 212 of the insulating layer 210, and an outer edge 224 aligned with the outer edge 214 of the insulating layer.

In this semiconductor device assembly 200, the lower conductive layer 220 is intended to be a ground plane. In order to effect this function, vias 230 are formed near the inner edge 222 of the lower conductive layer 220, which vias 230 extend through the layer 220, through the layer 210, and through the layer 206, and the vias are usually plated through so that individual traces 208 may be electrically connected to the ground plane 220 near the semiconductor device 202. However, as is readily apparent from FIG. 2B, in order to accommodate such vias 230, which are on the order of 0.004 inches (100 µm) in diameter, it is necessary to dedicate two adjacent conductive traces, in this case the traces 208b and 208c to making the connection to the ground plane. Because of the modern drive to very high lead count packages, the individual traces 208 are preferably on the order of 0.002 inches (50 µm) wide and spaced at a 0.002 inch pitch. And, as is readily seen in FIG. 2B, this means that the two conductive traces 208b and 208c are tied together in the area of the via, and hence cannot carry two separate signals. This, of course, wastes valuable traces (leads 208), in an environment where the number of distinct traces carrying distinct signals is a major design criteria.

In a similar manner, vias 232 are formed near the outer edge 224 of the lower conductive layer 220, which vias 232 extend through the layer 220, through the layer 210, and through the layer 206. Again, it will typically take at least two adjacent traces (e.g., 208b, 208c) to accommodate such a via, due to sizing restrictions. Nevertheless, the ground plane 220 can be connected to conductive lines 208b and 208c near the outer edge 214 of the insulating layer 210. In this manner, using vias 230 near the inner edge 212 of the insulating layer 210 and using vias 232 near the outer edge 214 of the insulating layer 210, a ground connection can be made to an external lead (right hand portion of the leads 208), passed by the via 232 to another plane 220, and brought back up to the original layer 206 near the die 202. Electrical benefits will accrue by virtue of the largely separate ground plane 220.

FIG. 2B also shows that intermediate portions of the traces 208b and 208c are preferably excised (or simply not formed), and these intermediate portions of the traces 208b and 208c are shown in dashed lines. This ensures that the electrical path from one end of the leads 208b and 208c to the other ends thereof is largely in the second, offset (from the first 206) plane 220.

Hence, the technique 200 is illustrative of prior art techniques of forming a two-metal-layer, TAB-type semiconductor device assembly, using vias to connect the two metal layers together. This is commonly called "two metal layer TAB tape". As discussed above, using vias to connect one plane to another will unavoidably reduce the number of distinct leads available for inputting and outputting signals to/from the die.

A further problem with two metal layer TAB tape is that the bottom layer 220 is a thin foil, much like the top layer 206 (but not patterned into traces). Hence, the bottom layer 220 does not provide significant additional mechanical support for the substrate 204, nor does the bottom layer 220 provide much in the way of enhanced thermal performance. Further, even if the intermediate portions (dashed lines, FIG. 2B) of the conductors 208b and 208c are removed, there is still a significant portion of these conductors in the signal layer 206, therefore allowing parallel paths for ground. Further each tape (substrate) design is specific to a particular application, i.e., must be customized for the particular "pin-outs" of a particular semiconduotor device. (The term "pin-outs" is used to indicate which bond site on the die is used for signals, which is used for power and which is used for ground. Pin-outs typically vary widely from device-to-devices.) Further, the manufacture of such two metal layer TAB tapes is relatively expensive (i.e., as compared with the inventive techniques disclosed below.

MULTI-LAYER FLEXIBLE SUBSTRATE HAVING A SECOND CONDUCTIVE PLANE

According to the present invention a flexible substrate, such as a TAB tape, is provided with a first conductive layer having patterned lines (traces) primarily for carrying signals to and from the die, and is provided with a second conductive layer for providing power and/or ground connections on a plane offset from and insulated from the first conductive layer. Inasmuch as the first conductive layer carries all of the signals (versus power and ground), it is sometimes referred to herein as a "signal layer". The layer 206 of FIGS. 2A and 2B is such a signal layer. The flexible TAB tape substrate, a semiconductor device assembly employing same, tools for manufacturing same, and methods of manufacturing same are disclosed herein.

Figure 3A:
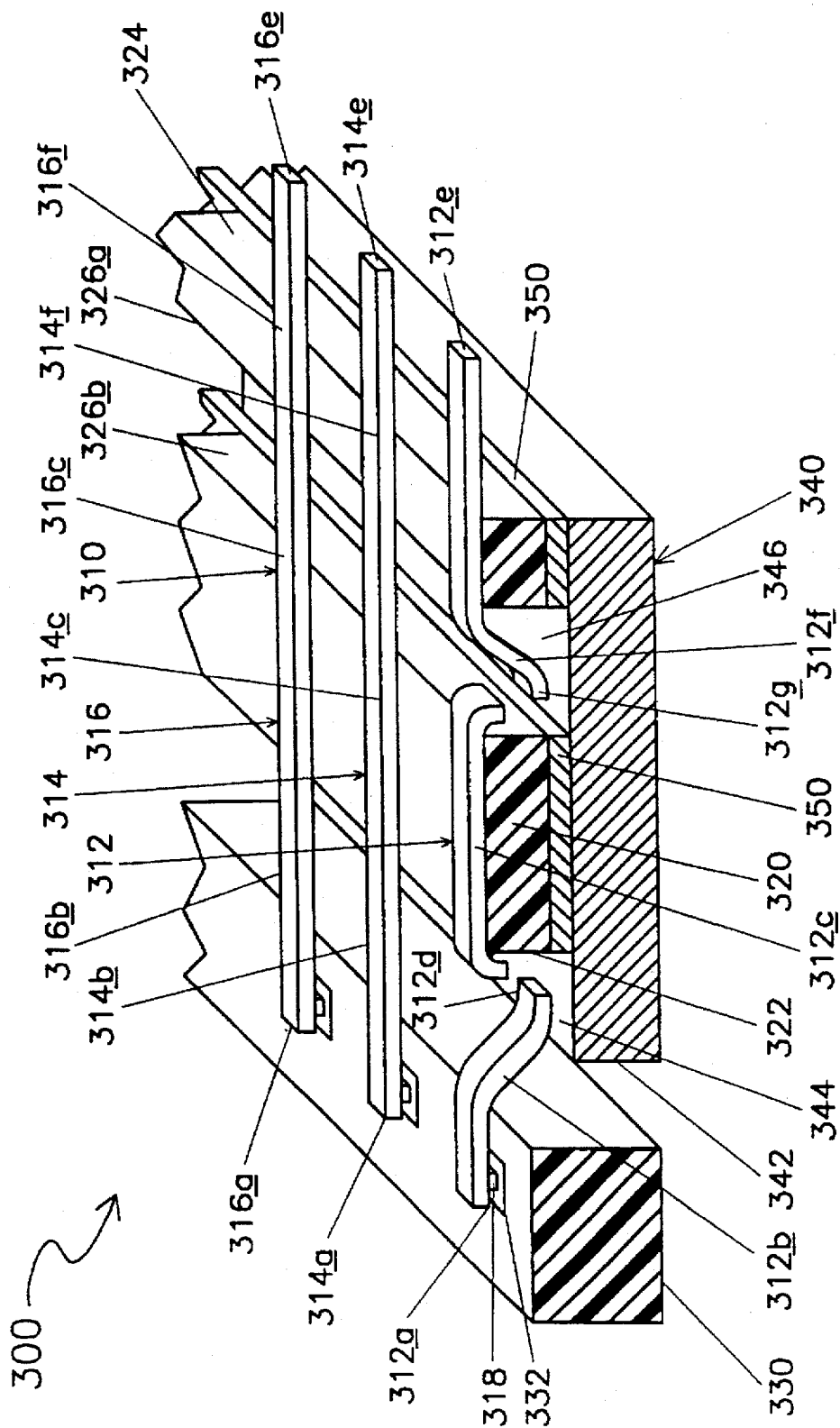
FIG. 3A is a perspective view, partially in cross-section, of a multi-layer flexible substrate mounting a semiconductor die, with one additional conductive layer, according to the present invention.

FIG. 3A shows a relevant portion of a semiconductor device assembly 300, partially assembled (not encapsulated or lidded), employing the inventive technique of breaking, bending and bonding selected leads to a second conductive layer using a TAB process.

A first conductive layer 310 is patterned to have a plurality of fine-pitch conductive leads (traces) 312, 314 and 316 (only three of what may be hundreds of these leads are shown, for illustrative clarity). The first conductive layer 310 is supported by an underlying insulating layer 320. The first conductive layer 310 may be formed of a thin copper foil, on the order of one mil thick. The insulative layer 320 may be formed of a thin plastic layer, such as polyimide, on the order of five mils thick. This is standard for TAB tape semiconductor device assembly fabrication.

The polyimide layer 320 has a central opening formed by its inner peripheral edge 322, and the opening is sufficiently large to accommodate a semiconductor die 330. The opening 322 is on the order of 1.0 mm (one millimeter) larger than the die 330. This is fairly standard for TAB tape.

Inner ends 312a, 314a and 316a of the leads 312, 314 and 316, respectively, are each TAB bonded with bumps 318, preferably gold bumps, to "bond sites" 332 on the top circuit-containing surface (circuits not shown) of the die 330. This is a well known procedure. The bumps may be on the leads, on the die, or the inner ends of the leads may be TAB bonded to the die without using bumps (See U.S. Pat. No. 4,842,662).

Inner end portions 312b, 314b and 316b of the leads 312, 314 and 316, respectively, span the gap between the outer edge of the die 330 and the inner edge 322 of the polyimide layer 320. As indicated hereinbefore, the distance between the die and the inner edge 322 of the polyimide layer 320 is on the order 1.0 mm. Generally, this is according to established TAB procedures.

As will be seen, the inner end portion of selected leads, in this example the lead 312 are broken and bent downward past the polyimide layer 320 to contact a second conductive plane. This is a marked departure from established TAB procedures.

Intermediate portions 312c, 314c and 316c or the leads 312, 314 and 316, respectively, are supported by the polyimide layer 320. This is according to established TAB procedures.

According to the invention, a second conductive layer 340 is affixed to the underside of the polyimide layer 320 (opposite the first conductive layer 310) using a suitable adhesive 350, such as a 2 mil thick layer of epoxy. The second conductive layer 340 is formed as a square, relatively (vis-a-vis the layer 310) rigid ring, having an inner peripheral edge 342 forming an opening slightly (on the order of 0.5 mm) smaller than the opening formed by the inner edge 322 in the polyimide layer 320, and slightly (on the order of 0.5 mm) larger than the die 330. Hence, an inner edge portion 344 of the second conductive layer 340 is exposed within the opening formed by the inner edge 322 in the polyimide layer 320, on the order of 0.5 mm all around the inner edge 322 of the polyimide layer 320.

According to the invention, the inner end portion 312b of the selected leads 312 is severed (cut) at the inner edge 322 of the polyimide layer 320. Hence, the inner end portion 312b has one end 312a bonded to the die 330, and another "free" end 312d. The free end 312d is bent downward, past the polyimide layer 320, and using a TAB bonding technique, either with bumps or without (shown without as is disclosed in the aforementioned U.S. Pat. No. 4,842,662), or other suitable TAB bonding technique, the free end 312d of the selected lead 312 is bonded to the exposed inner edge portion 344 of the second conductive layer 340. In this manner, a connection is made from selected bond sites 332 on the die, via the very short inner end portions 312b of selected traces 312, to a second conductive layer 340 which is discrete and offset from the first conductive (signal) layer 310.

In a similar manner, the selected leads 312 are connected to an outer edge portion 346 of the second conductive layer 340, as follows. The polyimide layer 320 has an outer edge 324. The leads 312, 314 and 316 extend beyond this edge 324 a suitable distance for allowing connection of the outer ends 312e, 314e and 316e of the leads 312, 314 and 316, respectively, to external systems and components, such as on a printed circuit board, or via the intermediary of a socket.

Slightly, on the order of 1.0 mm within the outer edge 324 (i.e., within the four outer edges) of the polyimide layer 320, there is provided an elongated slit 326 through the polyimide layer, paralleling the respective edge 324. The slit 326 has an outer edge 326a and an inner edge 326b, and is on the order of 0.5 mm wide (width determined from outer edge 326a to inner edge 326b).

The second conductive layer 340 extends outward beyond and underneath the slit 326, so that the outer edge portion 346 of the second conductive layer 340 is exposed within a "window" formed by the slit 326.

Outer end portions 312f, 314f and 316f of the leads 312, 314 and 316, respectively, span the slit 326. The outer end portion 312f of selected leads 312 (one shown) are severed (cut) at the inner edge 326b of the slit 326. Hence, the outer end portion 312f has one end 312e extending beyond the outer edge 324 of the polyimide layer 320, and partially supported thereby (by the portion of the polyimide layer between the slit and the outer edge of the polyimide layer), and another "free" end 312g. The free end 312g is bent downward, through the slit 326, past the polyimide layer 320, and using a TAB bonding technique such as is disclosed in the aforementioned U.S. Pat. No. 4,842.662, or other suitable TAB bonding technique, the free end 312g is bonded to the exposed outer edge portion 346 of the second conductive layer 340, in a manner similar to the bonding of the free inner end 312d to the exposed inner edge portion 344 of the second conductive layer 340. In this manner, a connection is made from selected outer lead ends 312e which are external to the semiconductor device assembly, via relatively short outer end portions 312f, to the second conductive layer 340.

Figure 3B:
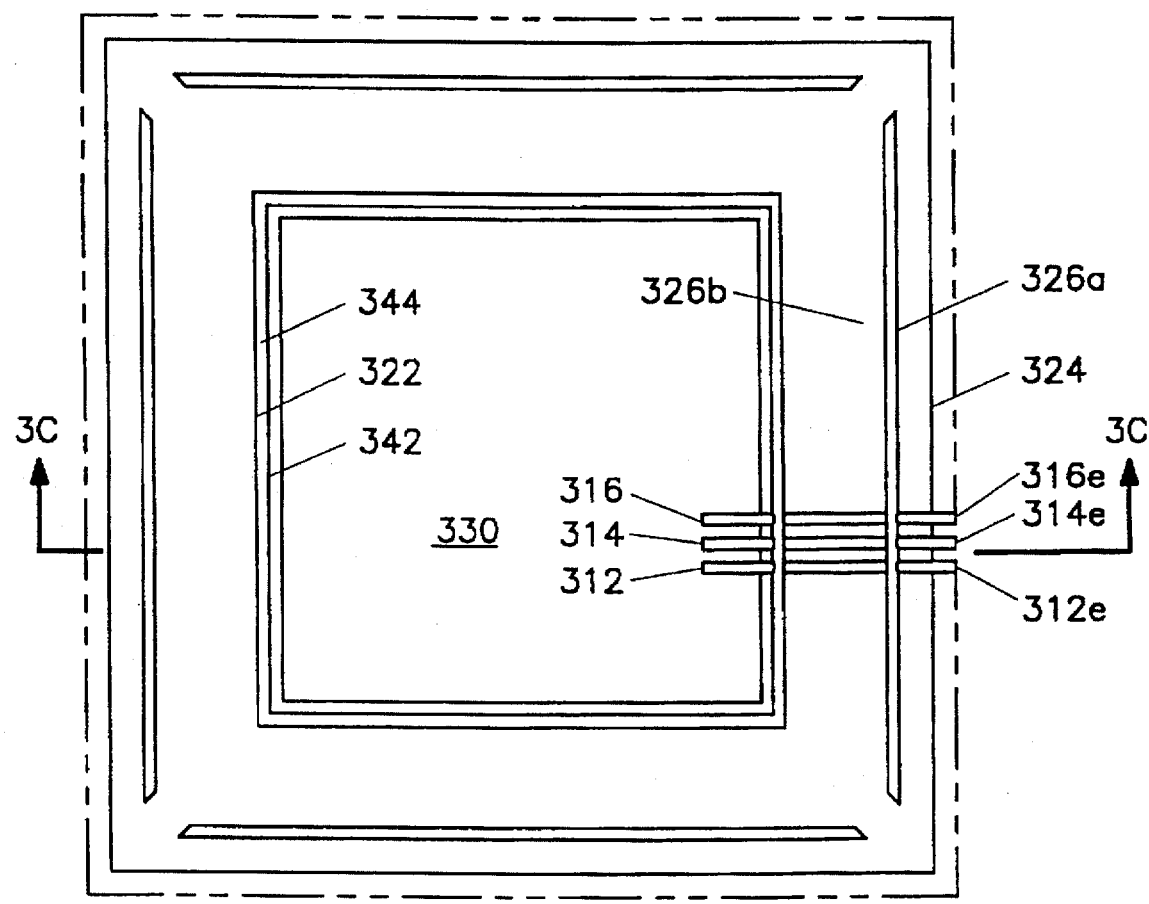
FIG. 3B is a top plan view of a semiconductor device assembly formed according to the technique of FIG. 3A.
Figure 3C:
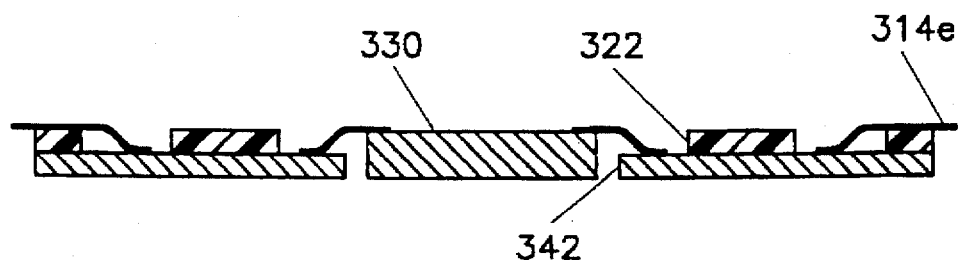
FIG. 3C is a cross-sectional view of the semiconductor device assembly of FIG. 3B.

FIGS. 3B and 3C show a more complete view of the entire semiconductor device assembly 300 than is shown in FIG. 3A. However, only three leads 312, 314 and 316 are illustrated, for clarity of illustration.

In FIG. 3B, we see more clearly that the polyimide layer 320 is formed as a square ring. As mentioned hereinbefore, the polyimide layer 320 is provided with a central opening formed by its inner peripheral edge 322, which opening is on the order of 1.0 mm larger than the die 330, all around the outer periphery of the die 330. And, as mentioned hereinbefore, the inner edge portion 344 of the second conductive layer 340, which is also formed as a square ring, extends from under the polyimide layer 320 to about midway between the inner edge 322 of the polyimide layer and the outer periphery of the die 330.

The "second conductive plane" established by the second conductive layer 340 is suitably employed to providing either ground or power from external supplies to the die, while the first conductive layer having lead traces is employed more exclusively (than with TAB tapes having only one conductive plane) for signals entering and exiting the semiconductor device from external sources. Preferably, the second conductive plane is connected to ground, for the electrical benefits that will accrue, as discussed hereinabove.

Evidently, if the second conductive layer is used for ground connections, it can be used for all of the ground connections to the die. This may amount to about 25 leads (e.g., 312) out of about 400 total leads (312 plus 314 plus 316) on the TAB tape substrate. And, another about 25 of the remaining (non-ground) leads in the signal layer (310) may be suitably employed for power, leaving the majority of the leads available for signal I/O.

Hence, as can be seen from FIGS. 3A-3C, a separate, second conductive plane is established for ground (or power) connections to a semiconductor device, and the second conductive plane is offset and insulated from a first conductive plane having signal traces. Significantly (considering an area defined by the polyimide, within the slits 326), there are no traces (e.g., 312) or portions thereof (namely 312c) providing a ground (or power) connection for the semiconductor device. In other words, in the first conductive plane (e.g., 310) the conductive traces carry only signals (and power) to and from the semiconductor device, and none of the intermediate portions (312c) of the traces are connected to ground (or power)—i.e., there are no "parallel" paths in the signal layer as there are in the two metal layer TAB tape shown in FIGS. 2A and 2B.

By way of definition, the term "substrate" is used to refer to the assembled layers 310, 320 and 340. The term "partial substrate" is used to refer to only some of those layers. Preferably, the epoxy layer 350 does not extend completely to the edges 322 and 326b of the polyimide layer, but is spaced about 1.0 mm inward of those edges.

In FIG. 3A, it is evident that the inner and outer ends of the intermediate portions 312c may become "stretched" over the respective polyimide edges 322 and 326b when the respective inner and outer end portions 312b and 312f of the traces 312 are cut and bent downward. This is acceptable, but is not necessary.

It is evident from FIG. 3A, that the inner end portions 312b are connected to the inner edge portion 344 of the second conductive layer in an "opposite" orientation than the outer end portions 312f are connected to the outer edge portion 346. However, in both cases, the free ends 312d and 312g are oriented towards each other and towards the disconnected intermediate portions 312c underneath which the second conductive layer 340 is disposed.

Although discussed in greater detail hereinbelow, it is important to note that the present technique differs from that disclosed in the aforementioned U.S. Pat. No. 4,842,662 in at least one very significant way. Generally, in the aforementioned patent, an already free end of a lead (24) is simply "downset" and bonded to a die (10). In the present invention, free ends (312d and 312g) are created by the action of forcing the lead down past the respective edge (322 and 326b) of the polyimide layer 320. In other words, the selected leads 312 are cut along their length in order to create the free ends 312d and 312g. These free ends 312d and 312g are not the "normal" free end 312a that the aforementioned patent is intending to bond to a die.

The preferred sequence of assembly is:

(a) provide a tape (partial substrate) having only signal traces (e.g., the first conductive layer 310) and the plastic support layer (e.g., the polyimide layer 320);

(b) locate the die (330) in the central opening (formed by edges 322) in the plastic support layer;

(c) connect the die to the inner ends of the signal traces (e.g., 312 and 314) using a TAB process (either bumped or bumpless);

(d) affix a second conductive plane (e.g., 340), having a smaller central opening (formed by inner edge 342) than the central opening in the plastic support layer, using a suitable adhesive (350), to the plastic support layer opposite the first conductive layer, so that an inner edge portion (344) of the second conductive layer is exposed in the opening of the plastic support layer;

(e) break, bend and bond free ends (312d) of inner end portions (312b) of selected traces (312) to the exposed inner edge portion (344) of the second conductive layer;

(f) break, bend and bond free ends (312g) of outer end portions (312f) of the same selected traces to an outer edge portion (346) of the second conductive layer exposed by a slit (326) near the outer edge of the plastic support-layer; and (g) complete assembly of the semiconductor device assembly using normal TAB process flow, i.e., encapsulating the die, etc.

The steps (e) and (f) are preferably performed with a thermosonic TAB bonding process, discussed hereinbelow. However, such bonding may be bumpless, or may be reflow or thermocompression bonding, or may employ bumps. Reflow bonding usually involves tin-on-tape, and gold bumps. Thermocompression bonding usually employs gold bumps, combined with force and high temperature.

The advantages of the present inventive technique over the two metal layer TAB tape (FIGS. 2A and 2B) include reduced cost, design flexibility, added mechanical support for the substrate and the finished semiconductor device assembly, no limitations on inner lead via hole pitches (compare FIG. 2B), better electrical performance by avoiding parallel ground paths, and better thermal performance.

Regarding design flexibility, it is evident that a "generic" TAB tape can be formed for a variety of semiconductor devices with various "pin-outs" (which pins are designated for signal, power and ground), and then (later) certain leads (312) can be selected for connection to the second (ground) plane. This is not possible with the two-metal-layer TAB tape of FIGS. 2A and 2B, which must be customized for each semiconductor device having a different pin-out.

Further, with the addition of a second electrically unique plane into a TAB package, the semiconductor device assembly will perform better, the ratio of input/output connections versus ground connections will be reduced, and mechanical support will be added to a relatively flexible package. Obtaining these advantages at the relatively low cost afforded by the present inventive technique makes for an attractive semiconductor packaging technique.

The second conductive layer 340 can be made of any electrically conductive material. The thickness of the second conductive layer can range from very thin, on the order of one mil, to very thick, on the order of one inch. In any case, it is evident that the thickness of the second conductive layer 340 can be established as thick as desired, to provide additional support for the substrate and to provide enhanced thermal characteristics for the substrate, much more so than the second conductive foil layer employed in the two-metal-layer TAB tape shown in FIGS. 2A and 2B.

Figure 3D:
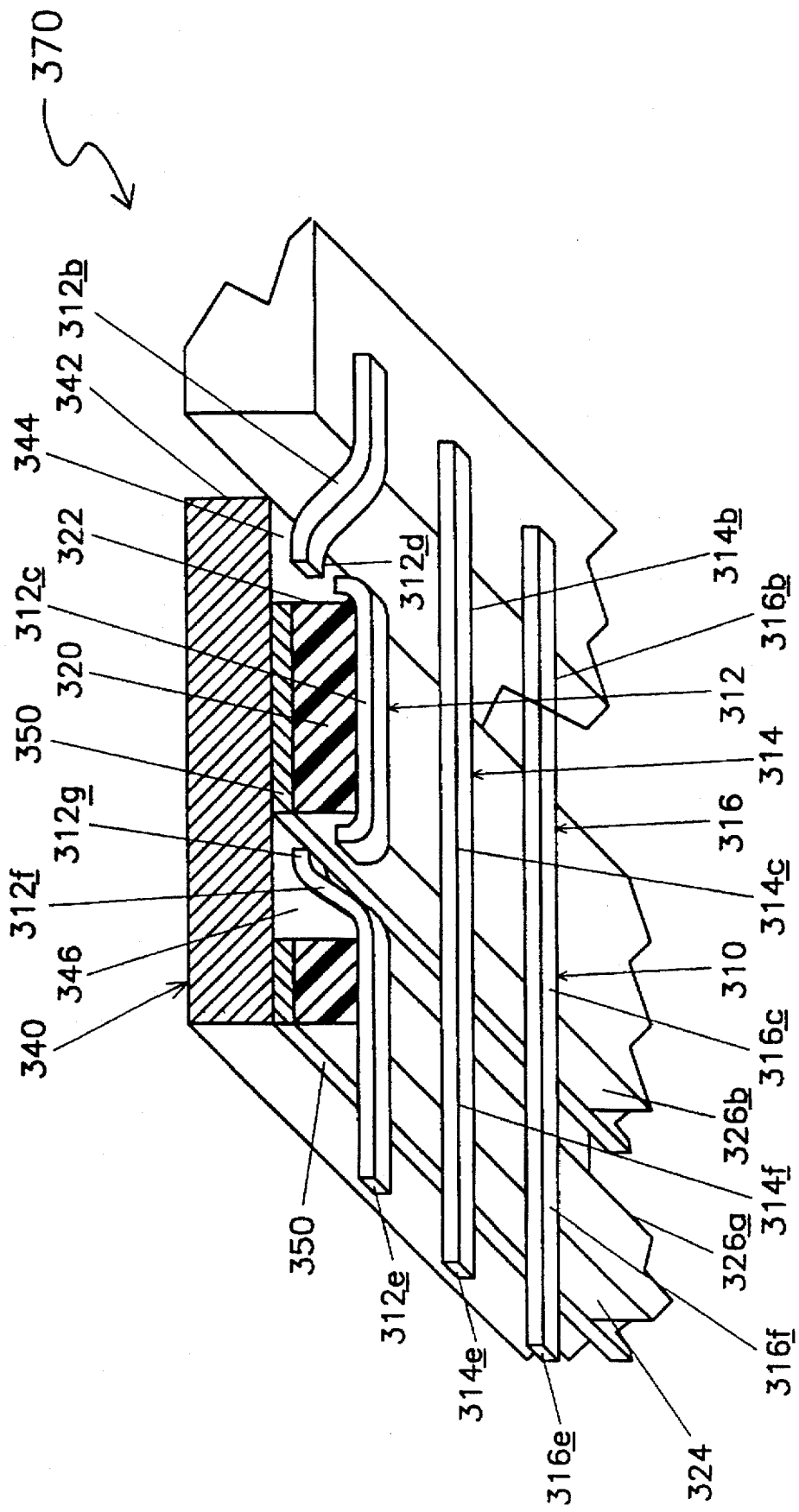
FIG. 3D is a perspective view, partially in cross-section, of an alternate embodiment of the multi-layer flexible substrate mounting a semiconductor die, with one additional conductive layer, according to the present invention.

FIG. 3D shows an alternate embodiment of a substrate 370, using the same components as the substrate 300 of FIG. 3A, but with the second conductive layer on top rather than below the first conductive layer. In this embodiment, the plastic layer 320 is disposed atop (on the other side of) the lead layer 310, and the second conductive layer 340 is disposed atop (rather than underneath) the plastic layer 320.

MULTI-LAYER FLEXIBLE SUBSTRATE HAVING SECOND AND THIRD CONDUCTIVE PLANES

FIGS. 2A and 2B illustrated a prior art technique of "two-metal-layer TAB tape", wherein an additional (second) foil layer was added and connected by vias through an insulating layer to the first, patterned, conductor layer. The disadvantages and limitations of such a technique have been discussed.

It is also known to provide a "three-metal-layer TAB tape" by adding yet another foil layer to the two-metal-layer TAB tape. Evidently, this will create the need for yet more vias, thereby even more significantly reducing the number of lead traces available for I/O, and will suffer from the same limitations and disadvantages, discussed above, that apply to two-metal-layer TAB tape.

According to the present invention, a second and a third conductive layer are added to a TAB substrate, for carrying ground and power, so that these currents are isolated from the first signal layer. The disclosed technique is similar in many regards to that disclosed with respect to FIGS. 3A–3C.

Figure 4A:
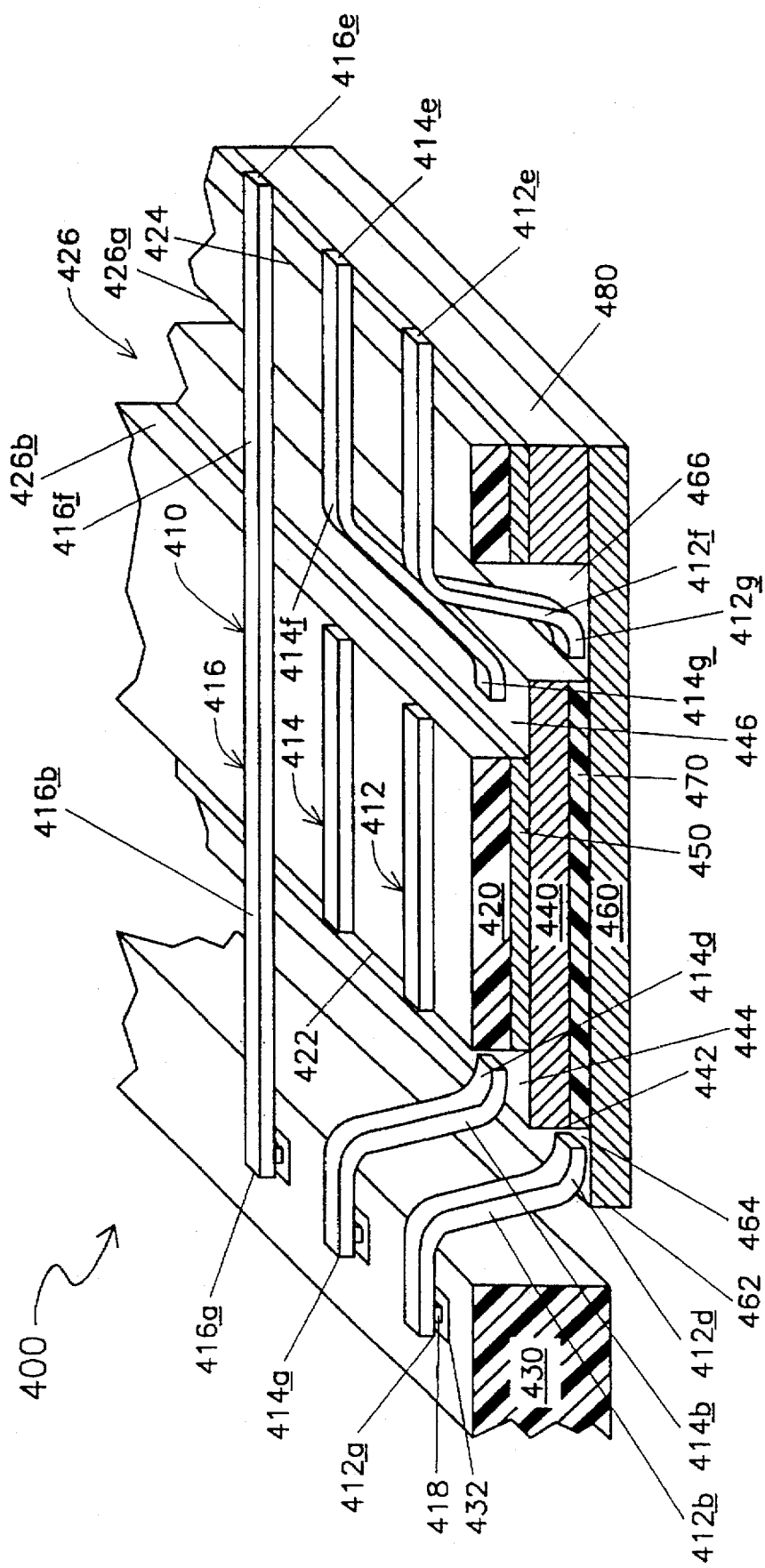
FIG. 4A is a perspective view, partially in cross-section, of a multi-layer flexible substrate mounting a semiconductor die, with two additional conductive layers, according to the present invention.

FIG. 4A shows relevant portion of a semiconductor device assembly 400, partially assembled (not encapsulated or lidded), employing the inventive technique of breaking, bending and bonding selected leads to a second and a third conductive layer using a TAB process. It will be appreciated, from the description that follows, that selected leads may be bent and bonded to one additional conductive layer, and may be connected by vias to another conductive layer. However, using vias is contrary to the general purpose of the present invention, which is to efficiently utilize the conductive traces, one by one, rather than two by two.

A first conductive layer 410 is patterned to have a plurality of fine-pitch conductive leads (traces) 412, 414 and 416 (only three shown, for illustrative clarity). The first conductive layer 410 is supported by an underlying insulating layer 420. The first conductive layer 410 may be formed of a thin copper foil, on the order of one mil thick. The insulative layer 420 may be formed of a thin plastic layer, such as polyimide, on the order of five mils thick.

The polyimide layer 420 has a central opening formed by its inner peripheral edge 422, and the opening is sufficiently large to accommodate a semiconductor die 430. The opening 422 is on the order of 2.0 mm (one millimeter) larger than the die 430. Generally, the opening formed by the inner edge 422 of the polyimide layer must be twice as large as the corresponding opening 322 of the FIG. 3A embodiment.

Inner ends 412a, 414a and 416a of the leads 412, 414 and 416, respectively, are each to "bond sites" 432 on the top of the die 430, preferably using bumped or bumpless TAB techniques.

Inner end portions 412b, 414b and 416b of the leads 412, 414 and 416, respectively, span the gap between the outer edge of the die 430 and the inner edge 422 of the polyimide layer 420.

As will be seen, the inner end portions of selected leads, in this example the leads 414 and 412 are broken and bent downward past the polyimide layer 420 to contact second and third conductive planes, respectively.

Intermediate portions 412c, 414c and 416c or the leads 412, 414 and 416, respectively, are supported by the polyimide layer 420.

According to the invention, a second conductive layer 440 is affixed to the underside of the polyimide layer 420 (opposite the first conductive layer 410) using a suitable adhesive 450, such as a 2 mil thick layer of epoxy. The second conductive layer 440 is formed as a square, relatively (vis-a-vis the layer 410) rigid ring, having an inner peripheral edge 442 forming an opening slightly (on the order of 0.5 mm) smaller than the opening formed by the inner edge 422 in the polyimide layer 420. Hence, an inner edge portion 444 of the second conductive layer 440 is exposed within the opening formed by the inner edge 422 in the polyimide layer 420.

According to the invention, the inner end portion 414b of the selected lead 414 is severed (cut) at the inner edge 422 of the polyimide layer 420. Hence, the inner end portion 414b has one end 414a bonded to the die 430, and another "free" end 414d. The free end 414d is bent downward, past the polyimide layer 420 and, preferably using a bumpless TAB bonding technique, the free end 414d of the selected lead 414 is bonded to the exposed inner edge portion 444 of the second conductive layer 440. In this manner, a connection is made from selected bond sites 432 on the die, via the very short inner end portions 414b of selected traces 414, to a second conductive layer 440 which is discrete and offset from the first conductive (signal) layer 410.

So far, this is all very similar to the second conductive plane 340 of FIG. 3A.

In this example 400, a third conductive plane 460 is provided beneath the second conductive plane 440, and is electrically isolated therefrom by an insulating layer 470, as shown. The insulating layer is suitably a polyimide layer, but can be an adhesive (e.g., epoxy). In practice, a sub-assembly comprising the second conductive layer 440, the insulating layer 470 and the third conductive layer 460 may be formed separately from the remainder of the substrate (i.e., the layers 410 and 420), and then bonded thereto with the adhesive 450. Ultimately, as will become evident, the second conductive layer can be used for providing power from an external source to the die, and the third conductive layer 460 can be used for providing a ground connection to the die. In this manner, the layers 440 and 460, separated by the insulating layer 470 form a built-in (within the ultimate packaged semiconductor device assembly) capacitor for the power and ground connections, which has numerous electrical advantages. To this end, the layer 470 can be selected from suitable materials of suitable dielectric constant and thickness to establish a desired built-in capacitance.

The third conductive layer 460 is preferably formed of metal, and may be thicker than a foil in a manner similar to that concerning the second conductive layer 440. The third conductive layer 460 has a central opening defined by its inner edge 462 which is on the order of 0.5 mm smaller than the opening formed by the edge of the second conductive layer 440. In this manner, an inner edge portion 464 of the third conductive layer 460 is exposed within the openings in both the polyimide layer 420 and the second conductive layer 440.

According to the invention, the inner end portion 412b of a selected lead 412 is severed (cut) at the inner edge 422 of the polyimide layer 420. Hence, the inner end portion 412b has one end 412a bonded to the die 430, and another "free" end 412d. The free end 412d is bent downward, past the polyimide layer 420 and, preferably using a bumpless TAB bonding technique, the free end 412d of the selected lead 412 is bonded to the exposed inner edge portion 464 of the third conductive layer 460. In this manner, a connection is made from selected bond sites 432 on the die, via the very short inner end portions 412b of selected traces 412, to a third layer 460 which is discrete and offset from both the first conductive (signal) layer 410 and the second conductive layer 440.

Evidently, to implement this breaking and bending of leads (412 and 414) to two additional levels (460 and 440, respectively), it is important that the inner end portions of the leads being bent downward to the third conductive layer 460 be sufficiently long to reach same. Particular dimensions will depend upon particular applications, especially upon the thickness of the second conductive layer 440.

In the manner set forth above, it is taught how selected leads connected to the die can be cut, bent and connected to two additional conductive planes (layers), especially for making power and ground connections. In a manner similar to that shown in FIG. 3A, the outer ends of the selected leads are also connected to the outer edge portions of the additional two conductive planes.

The selected leads 414 are connected to an outer edge portion 446 of the second conductive layer 440, as follows. The polyimide layer 420 has an outer edge 424. The leads 412, 414 and 416 extend beyond this edge 426 a suitable distance for allowing connection of the outer ends 412e, 414e and 416e of the leads 412, 414 and 416, respectively, to external systems and components, such as on a printed circuit board, or via the intermediary of a socket.

Slightly, on the order of 1.0 mm within the outer edge 424 (i.e., within the four outer edges) of the polyimide layer 420, there is provided an elongated slit 426 through the polyimide layer, paralleling the respective edge 424. The slit 426 has an outer edge 426a and an inner edge 426b, and is on the order of 1.0 mm wide (twice the width of the slit 326, FIG. 3A).

The second conductive layer 440 extends outward partially, such as at least 0.5 mm, underneath the slit 426, so that the outer edge portion 446 of the second conductive layer 440 is exposed within a "window" formed by the slit 426. Outer end portions 412f, 414f and 416f of the leads 412, 414 and 416, respectively, span the slit 426.

The outer end portion 414f of selected leads 414 (one shown) are severed (cut) at the inner edge 426b of the slit 426. Hence, the outer end portion 414f has one end 414e extending beyond the outer edge 424 of the polyimide layer 420, and partially supported thereby (by the portion of the polyimide layer between the slit and the outer edge of the polyimide layer), and another "free" end 414g. The free end 412g is bent downward, through the slit 426, past the polyimide layer 420, and is bonded to the inner exposed (through the slit 426) edge 446 of the second conductive layer 440. In this manner, a connection is made from selected outer lead ends 414e which are external to the semiconductor device assembly, via relatively short outer end portions 414f, to the second conductive layer 440.

In contrast to the structure of FIG. 3A, wherein the second conductive layer 340 extended fully past the slit 326, in this embodiment 400, the second conductive layer 440 extends only partially (e.g., halfway) into the slit area. As we will see, the remaining half of the slit area is required for connecting to an exposed (through the slit 426) outer edge portion 466 of the third conductive layer 460.

The outer end portion 412f of selected leads 412 (one shown) are severed (cut) at the inner edge 426b of the slit 426. Hence, the outer end portion 412f has one end 412e extending beyond the outer edge 424 of the polyimide layer 420, and partially supported thereby (by the portion of the polyimide layer between the slit and the outer edge of the polyimide layer), and another "free" end 412g. The free end 412g is bent downward, through the slit 426, past the polyimide layer 420, past the second conductive layer 440, and is bonded to the inner exposed (through the slit 426) edge portion 466 of the third conductive layer 460. In this manner, a connection is made from selected outer lead ends 412e which are external to the semiconductor device assembly, via relatively short outer end portions 412f, to the third conductive layer 460.

Whereas in FIG. 3A we saw that the second conductive layer 340 extended to the outer edge of the polyimide layer 320, to the edge 324 thereof, we have seen that in this case 400 such is not feasible since it is desired to leave access past the second conductive layer 440 to the third conductive layer 460. Hence, as illustrated in FIG. 4A, it is shown to dispose a suitable spacer block between the top surface of the third conductive layer 460 and the lower surface of the polyimide layer 420, in an unsupported area of the polyimide layer 420 between its outer edge 424 and the edge 426a of the slit 426. The spacer block 480 can be formed as a separate element, and bonded with the epoxy 450 to the underside of the polyimide layer 420, or it can be an integrally formed part of the third conductive layer 460.

In the example shown in FIG. 4A, the ends of the intermediate portions of the cut and bent conductors 412 and 414 are shown not stretched over the respective edges 422 and 426b of the polyimide layer, for clarity. As stated hereinbefore, it is not necessary that these ends be stretched and bent over.

With reference to FIGS. 3A and 30, which showed that the second conductive layer 340 could be disposed atop the signal layer 310, it is also possible to dispose one or both of the second and third conductive layers 340 and 360 atop, rather than underneath, the signal layer 410. For example, the third conductive layer 460 could be disposed atop the signal layer 410, while the second conductive layer 440 remains disposed underneath.

The preferred sequence of assembling the TAB tape having two additional layers (440 and 460) is:

(a) provide a tape (partial substrate) having only signal traces (e.g., the first conductive layer 410) and the plastic support layer (e.g., the polyimide layer 420);

(b) locate the die (330) in the central opening (formed by edges 422) in the plastic support layer;

(c) connect the die to the inner ends of the signal traces (e.g., 412 and 414);

(d) sub-assembly the second and third conductive layers (440 and 460) together, including an insulating layer (470) therebetween, and a spacer element (480) if required;

(e) affix the sub-assembly (440, 470, 460, 480) to the plastic support layer opposite the first conductive layer, using a suitable adhesive (450);

(f) break, bend and bond free ends (414d) of inner end portions (414b) of selected traces (414).to the exposed inner edge portion (444) of the second conductive layer (440), and break, bend and bond free ends (412d) of inner end portions (412b) of selected other traces (412) to the exposed inner edge portion (464) of the third conductive layer (460);

(g) break, bend and bond free ends (414g and 412g) of outer end portions of the same selected and selected other traces (414 and 412) to outer edge portions (446 and 466) of the second and third conductive layers (440 and 460), through a slit (426) near the outer edge of the plastic support layer; and (h) complete assembly of the semiconductor device assembly using normal TAB process flow, i.e., encapsulating the die, etc.

The steps (f) and (g) are preferably performed with a thermosonic TAB bonding process, discussed hereinbelow. However, such bonding may be bumpless or may employ bumps.

In any of the embodiments described above, it is clearly possible that the conductors are bonded to the die and to the additional (second and third) conductive layers using bumps, solder balls, or the like, rather than a bumpless TAB process. Nevertheless, the inventive concept of cutting, bending and bonding to underlying additional conductive layers is entirely applicable to non-TAB flexible substrates, however they may be formed.

THERMOSONIC BONDING PROCESS FOR FABRICATING MULTI-LAYER FLEXIBLE SUBSTRATES HAVING SECOND AND THIRD CONDUCTIVE PLANES

As mentioned previously, U.S. Pat. No. 4,842,662 is primarily directed to a "downset" operation whereby an already free end of a conductor is bumpless-bonded to a die.

As further mentioned previously, such a technique is suitable for bonding the free ends 312a, 314a and 316a of the conductors 312, 314 and 316, respectively (FIG. 3A) and the free ends 412a, 414a and 416a of the conductors 412, 414 and 416, respectively (FIG. 4A) to a die 330.

And, as suggested previously, there is a different and more preferred way to bond the "created" free ends 312d, 312g, 412d, 412g, 414d and 414g to second and third conductive layers. As mentioned previously, the present method is different from that of the U.S. Pat. No. 4,842,662 in that the free ends to be bent towards and bonded to the second and third conductive layers must first be cut —and this cutting operation makes use of the sharp edges (322, 326b, 422, 426b) of the polyimide layer (320, 420).

Beyond the cutting operation that creates the free ends to be bonded, the free ends are bonded in a manner different than that of the aforementioned U.S. Pat. No. 4,842,662.

For example, the tool used in the present inventive manufacturing is different than that of the U.S. Pat. No. 4,842,662. A tool is not shown in that patent, but a depiction of a bond formed with the tool is shown in FIG. 8, therein. And the text describes that "the width of the head of the bonding tool should be greater than the width of the TAB tape (conductor) which the head of the bonding tool presses upon." (Column 6, lines 58–61)

Figure 5A:
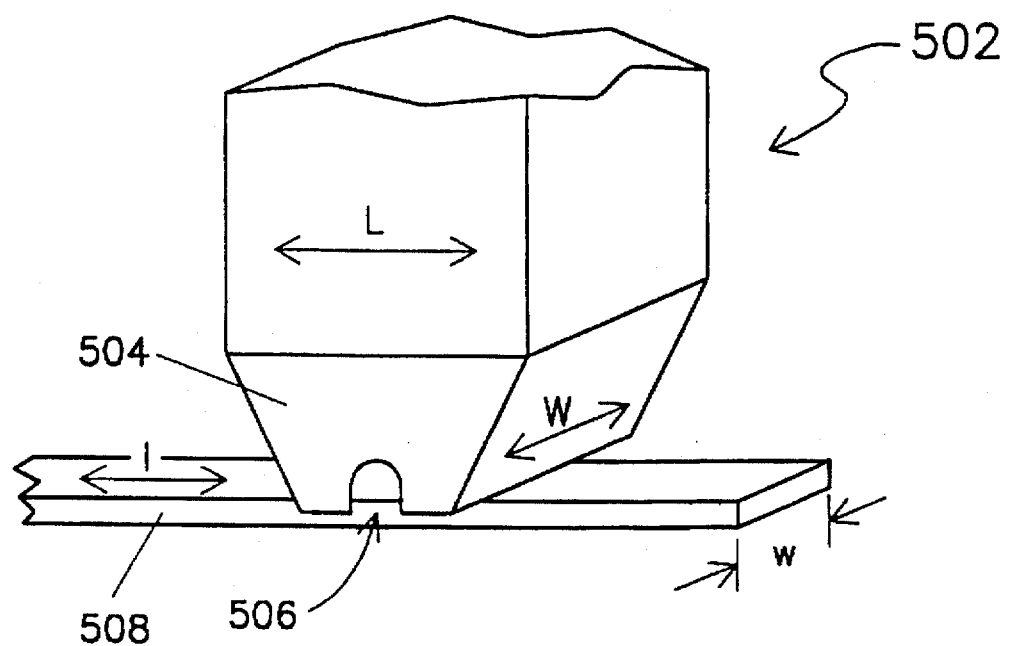
FIG. 5A is a perspective view of a prior art thermo-sonic bonding technique.

By way of further example, with reference to FIG. 5A herein, it would appear that the bonding tool 502 implied, but not shown, in the U.S. Pat. No. 4,842,662 has a lead 504 with a widthwise channel 506 extending transversely (widthwise) across the head 504. This is evident from the description of a single stroke of the bonding tool in the patent, as well as from the text describing how it is "highly preferred" that "the ultrasonic energy is applied along the long axis of the TAB tape being attached to the pad. When this is done, the resulting relative motion induced between the tape and the pad produces a rapid longitudinal 'wiping' of the two surfaces along this axis." (see column 7, lines 13–22).

FIG. 5A, herein, shows such a bonding tool 502 having a width "W" larger than the width "w" of the conductor 508 being bonded. A two-headed arrow "L" shows the bonding tool vibrating in the longitudinal axis of the conductor 508, and the coaxial motion "l" (lower case 'el') imparted to the conductor for the stated "wiping". FIG. 8 in the patent shows a conductor after bonding, and the raised ridge left by the transverse channel 506 on the conductor 508 (24 in the patent) is evident. This channel 506 would help keep the conductor 508 and the head 504 of the tool 502 moving together as one, longitudinally, to impart the desired wiping action of the conductor against the bond pad (26 in the patent), rather than allowing the tool to vibrate longitudinally with respect to the conductor. In other words, the head 504 of the prior art tool is specifically formed to control longitudinal motion of the conductor.

In contrast to the bonding tool of the prior art, the bonding tool of the present invention is specifically formed to control transverse (widthwise) motion of the conductor as it is cut and bent, and ultimately bonded to the second or third conductive layer (e.g., 440 or 460).

Particularly with respect to the cutting operation, which occurs as the tool head is pressed down against the inner end portion (e.g., 312b) of the conductive lead (e.g., 312) and is sheared off by the edge (e.g., 322) of the polyimide layer (e.g., 320), it is extremely important that the conductor does not displace itself widthwise. Hence, the bonding tool of the present invention is designed to prevent transverse (widthwise) movement of a conductive lead (trace) being cut, bent and bonded.

Figure 5B:
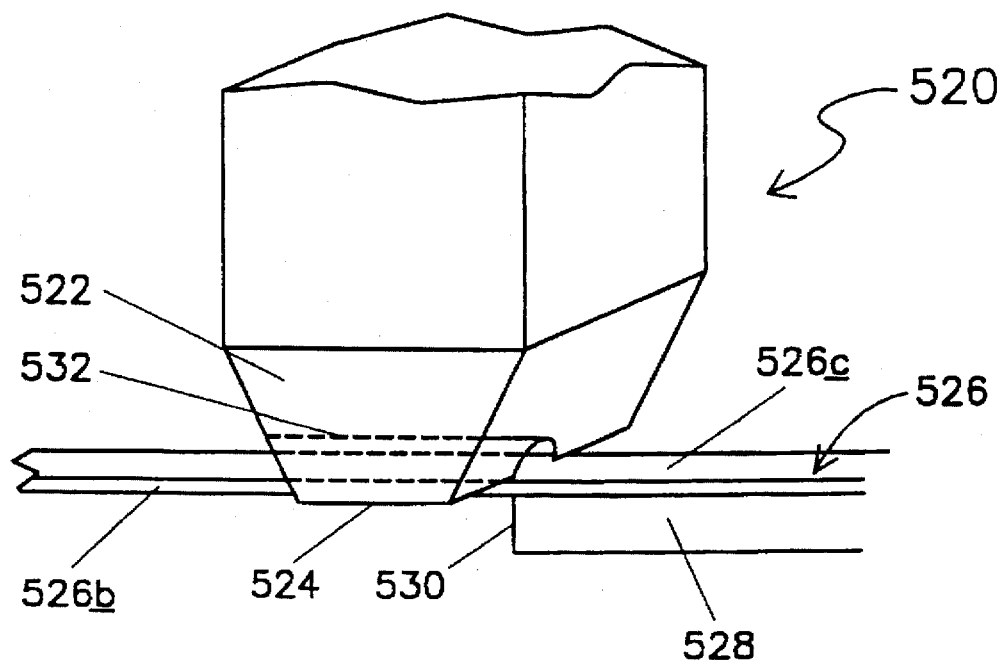
FIG. 5B is a perspective view of a bonding tool and technique, according to the present invention.

FIG. 5B shows the bonding tool 520 of the present invention. The lead 522 of the tool is wedge shaped, having a straight, partially flat edge 524 extending widthwise across a conductor 526 (e.g., 312) being cut, bent and bonded. A polyimide layer 528 (e.g., 320) is shown supporting the conductor along an intermediate portion 526c (e.g., 312c) thereof. The tool 520 is shown coming down on an inner end portion 526b (e.g., 312b,) of the conductor 526, closely adjacent an edge 530 (e.g., 322) of the polyimide layer 528. (The numbers in parentheses are cross references to exemplary FIG. 3A. The tool 520 and process described herein can be applied as well to cutting, bending and bonding the selected conductors 412 and 414 in FIG. 4A.)

According to the invention, in order to prevent relative widthwise motion between the bonding tool head 522 and the conductor 526 being cut, bent and bonded, the head 524 is provided with a longitudinal groove 532 extending into the head 522 from the widthwise edge 524 thereof. Preferably, as in the prior art (FIG. 5A) the width of the bonding tool head is greater than the width of the conductor being bonded. In the case of the bonding tool 520, the longitudinal groove 532 has a width on the order of 20–33% of the width of the conductor 526, so that it can easily be located widthwise in the center of the conductor with allowances for minor misalignments. The vertical depth of the groove 532 is on the order of 10–20% of the thickness of the conductor 526.

Figure 5C:
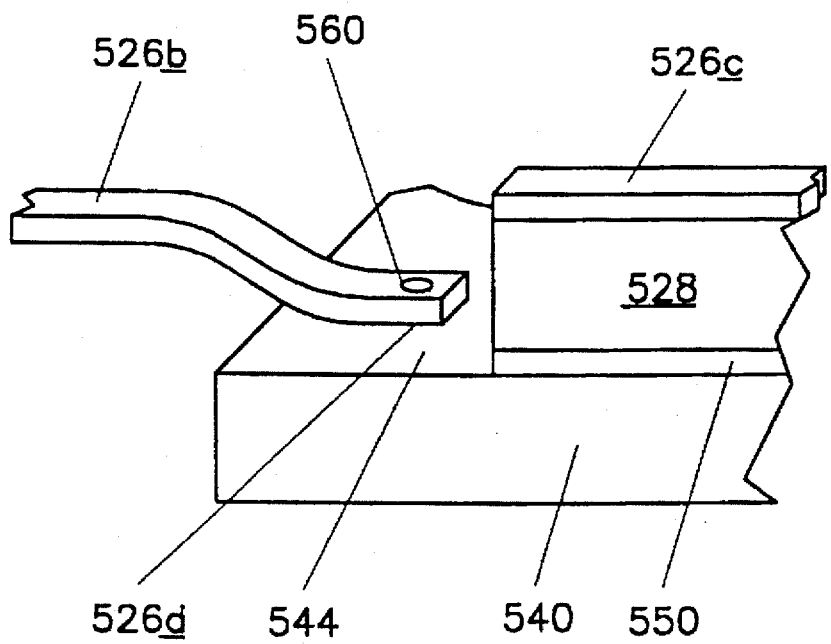
FIG. 5C is a perspective view of a bonding technique, according to the present invention.

FIG. 5C shows the inner end portion 526b of the conductor 526 having been bonded to a an exposed inner edge portion 544 (e.g., 344 of FIG. 3A) of a second conductive layer 540 (e.g., 340 of FIG. 3A). The tool 520 has been lifted away (not visible). There is, however, visible, a raised ridge 560 visible on the center (widthwise) top surface of the inner end portion 526b, running longitudinally (lengthwise) along the conductor 526 and located near the freed (by cutting) end 526d.

It is also possible that a longitudinal groove, such as the groove 532 could be added to the bonding tool 502 of the prior art (FIG. 5A), in which case there would be a transverse channel 506 as well as a longitudinal groove 532 in the head of the tool. This would prevent relative motion between the tool head and the conductor, in both the transverse (by the groove 532) and the longitudinal (by the channel 506) directions, and would leave a telltale cruciform-shaped raised ridge on the conductor. This is shown in FIG. 5E.

More importantly, however, is to take into account the demands made by the present invention on the tasks accomplished by the bonding tool. In the first instance, when the tool head bears down on the conductor (526), its job is to cause the conductor to break, or be cut, as nearly as possible to the edge (530) of the polyimide layer (528).

According to the invention, in such a "first" stroke of the tool, the conductor (526) is broken and lightly tacked (partially bonded) to the underlying second (or third) conductive layer (e.g., 340/540 or 560), close to the polyimide edge (530).

Further according to the invention, in order to ensure a good bond between the free end (526d) of the conductor and the underlying additional conductive layer, the tool is then lifted away from the conductor, repositioned, and brought to bear a second time onto the lightly tacked down conductor.

Figure 5D:
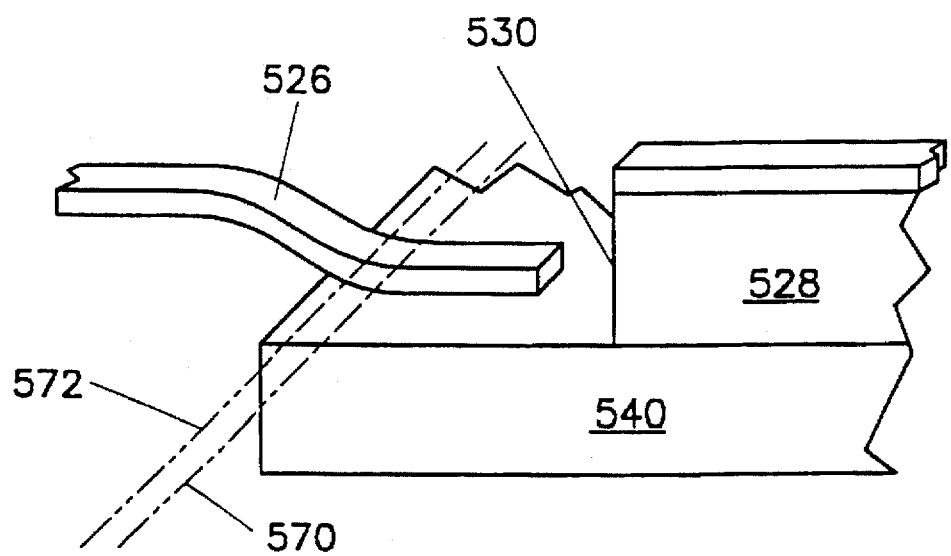
FIG. 5D is a perspective view of a bonding technique, according to the present invention.
Figure 5E:
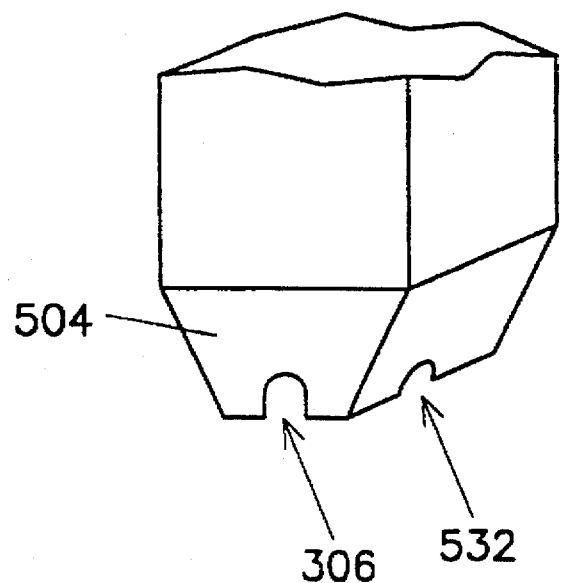
FIG. 5E is a perspective view of an alternate embodiment of a bonding tool, according to the present invention.

FIG. 5D shows the results of such a two-stroke bonding process. As shown, the conductor 526 is, in a first cutting/tacking stroke of the tool (e.g., 520) lightly tacked to the underlying conductive layer 540 at a position shown by the dashed line 570 close to the edge 530 of the polyimide layer helping to cut the conductor. The tool is then lifted and repositioned. Then, in a second bonding stroke, the tool is urged against the already lightly tacked conductor at a position indicated by the dashed line 572 slightly (e.g., 0.01 mils) further away from the polyimide edge 530.

The two-stroke bonding process described and shown in FIG. 5D, ensures that the bonding tool is pot required to cut, bend and bond, all in one stroke. Nor is the bonding tool required to bend and bond in one stroke, as it is in U.S. Pat. No. 4,842,662. Rather, the bonding tool is required only to cut and bend, and lightly tack, in a first stroke, whereupon the conductor being bonded is already stablely (relatively immovably) placed in contact with the surface to which it is being bonded. Then, the bonding tool can perform bonding, without the possibility of the conductor moving. Taking the stability of the lightly tacked (first stroke) conductor into account, it is possible that the head of the bonding tool is not provided with any grooves or channels at all, but rather is simply wedge shaped to perform efficient, contiguous (non-interrupted by grooves or channels) bonding.

Figure 5F:
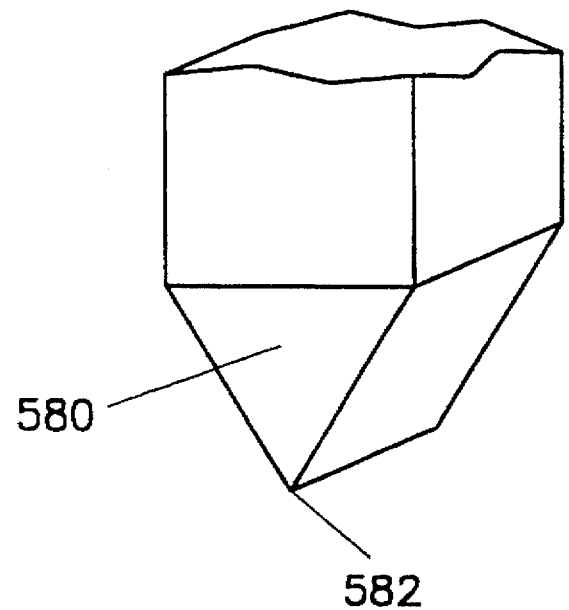
FIG. 5F is a perspective view of an another alternate embodiment of a bonding tool, according to the present invention.

It is also possible that the bonding tool could simply be a wedge, as shown in FIG. 5F. In this case, the tool head 580 is a simple wedge, with a non-grooved, non-channeled widthwise edge 582 bearing down on the conductor. Inasmuch as the first stroke is not required to effect a good bond, the simple wedge shape of the tool head 580 will provide more uniform pressure across the width of the conductor.

Irrespective of the advantages of using a two-stroke, or two-point cutting/bending/bonding process as described above, it is possible that a single point bonding process, such as is described in U. S. Pat. No. 4,842,662, or the like, will suffice. A single or double stroke thermo-compression, versus thermo-sonic or fellow, process will also work.

DIE PEDESTAL STAGES FOR FABRICATING MULTI-LAYER FLEXIBLE. SUBSTRATES HAVING SECOND AND THIRD CONDUCTIVE PLANES

Figure 6A:
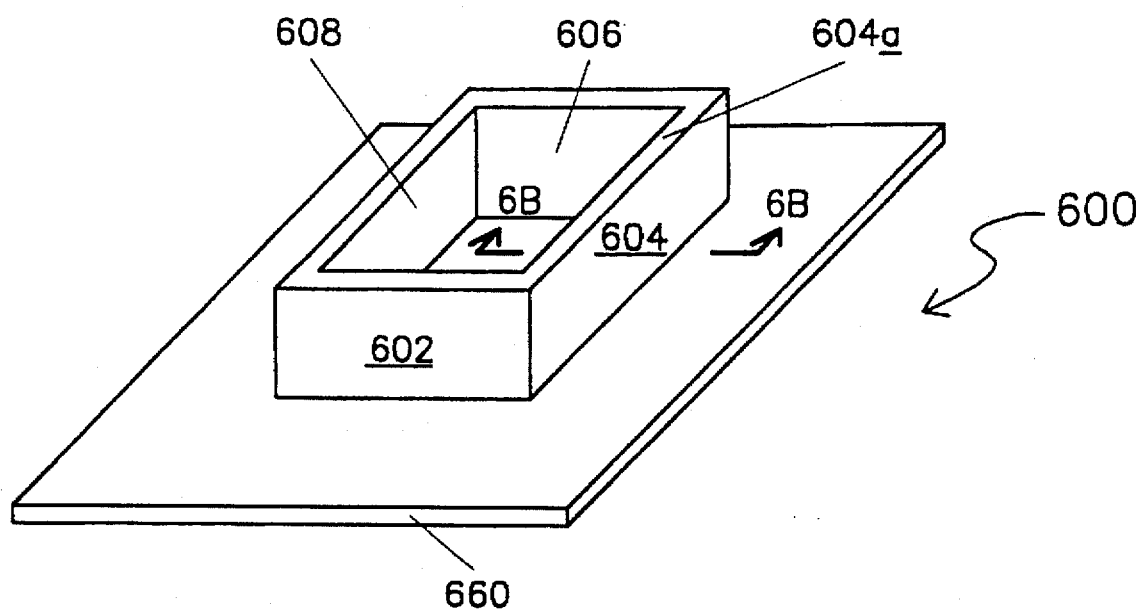
FIG. 6A is a perspective view of a tool (die pedestal) employed in the bonding technique of the present invention.
Figure 6B:
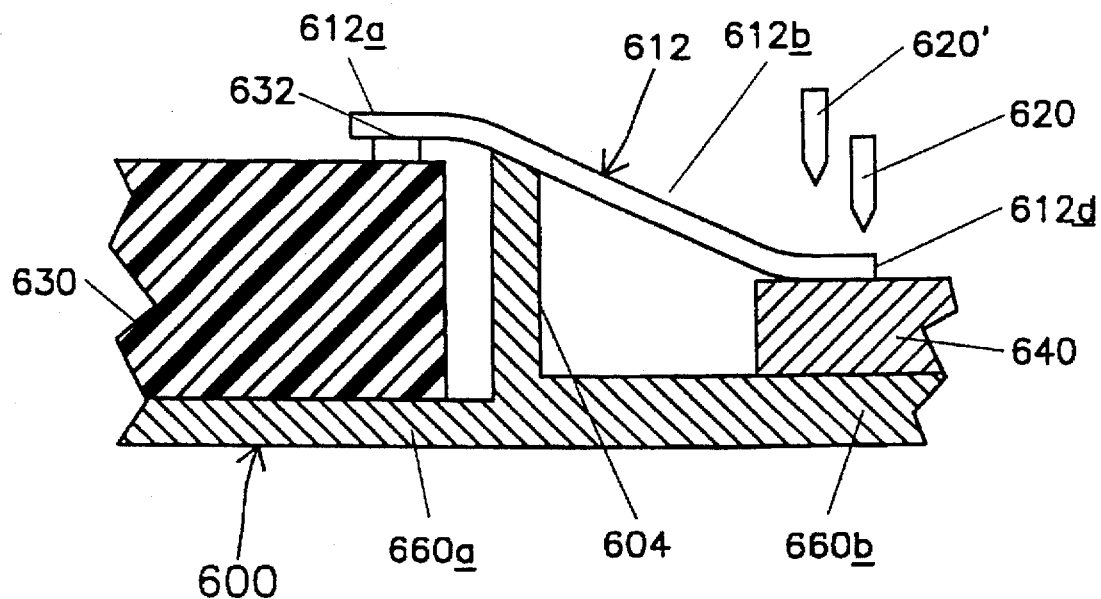
FIG. 6B is a cross-sectional view of the die pedestal of FIG. 6A, in use, and also shows the two-point bonding technique of the present invention.

FIG. 6A shows a pedestal 600 for use in supporting the die and the substrate when breaking, bending and bonding the leads. Compare FIG. 3A. The pedestal is essentially a "jig" to aid in bending the conductors, while preventing them from contacting the peripheral edge of the die. If the conductors were to contact the edge of the die, they would become shorted thereto. FIG. 6B shows the pedestal 600 in use.

As shown in FIG. 6A, the pedestal 600 has four walls 602, 604, 606 and 608 forming a square-tubular open structure. Given that most semiconductor dies are square, this is an appropriate shape to surround the peripheral edge of a die.

As mentioned hereinabove, the die is typically brought up to the tape substrate for bonding the bottom surfaces of the inner ends (e.g., 312a, 412a or 414a) of the conductive traces (e.g., 312, 412 or 414) to the top surface of the die, preferably using a bump-TAB process.

And, as mentioned hereinabove, the inner end portion (e.g., 312b, 412b or 414b) of the conductive trace is urged downward by a bonding tool to cause the inner end portion to sever from an intermediate portion (e.g., 312c, 412c, 414c) which is supported by an insulating layer (e.g., 320, 420), so that a free end (e.g., 312d, 412d, 414d) can be bonded to a second (e.g., 340, 440) or third (e.g., 460) conductive plane.

This is illustrated best in FIG. 6B, which shows a die 630, a conductive trace 612 bonded at one end 612a to the top of the die with a bump 632. Inasmuch as this aspect of the invention relates to severing/bending/and bonding to an offset second or third conductive layer 640, the polyimide layer is not shown (refer to FIGS. 3A or 5A).

FIG. 6B shows a bonding tool (e.g., 520) in a first position 620 bearing down upon the free end 612d of the conductor 612, during a preferred first cut/bend/tack stroke, and shows the bonding tool in a second position 620' offset from the first position, coming down onto the conductor 612 during a preferred second bonding stroke.

The pedestal 600 is provided with a base 660 at one end of the tubular opening formed by the walls 602, 604, 606 and 608. In FIG. 6B, it is clearly seen that the base 660 can be thinner in a region within the walls, and thicker in a region without the walls.

The thickness of the base portion 660a within the walls is established so that the walls are slightly, such as 0.05 mils, higher than the thickness of the die. In this manner, the walls extend slightly above the top surface of the die, to prevent the conductor 612 from coming into contact with the edge of the die, especially when it is being cut and bent (620).

The thickness of the base portion 660b is established to support the additional conductive layer 640 and may, as stated above, be thicker than the portion 660a in the event that the bottom surface of the die extends lower than the bottom surface of the additional conductive layer 640. Of course, the opposite could be true, in which case the portion 660a may well be thicker than the portion 660b.

The walls 602, 604, 606 and 608 are spaced apart from the die a small amount, on the order of 0.25 mils, to allow the die to be easily placed yet reasonably accurately retained within the opening formed by the walls. Damaging the die at this stage of the fabrication process, by too tight of a fit, is not a very good idea.

As is best seen in FIG. 6B, the top edges (604a) of the walls are preferably rounded, as well as extending above the top surface of the die. This is to ensure that when the conductor is bent around the top edge, the conductor and/or any plating on the conductor is not damaged during the cutting /bending/bonding process.

A discussion of using the additional couductive layer(s) as a heat sink, spreading heat away from the die, is presented below. It should be appreciated that the pedestal 600 could be left in place to function as a heat sink, in which case it would need to be at least partially non-conductive (namely the top edges of the walls in contact with the leads) to prevent shorting the leads. Anodized aluminum is suitable. Also, a thermally and electrically conductive pedestal, having an electrically non-conductive material (e.g., plastic) formed atop the sidewalls.

ADDITIONAL CONDUCTIVE LAYER(S) ACTING AS A HEAT SINK

As mentioned above, the additional conductive layer (e.g., 340, 460) can be thicker and stiffer than a conventional additional foil layer (e.g., 220). Hence, the additional conductive layer can not only "rigidize" the TAB tape, but it can also act as a heat spreader, of sorts.

Figure 7A:
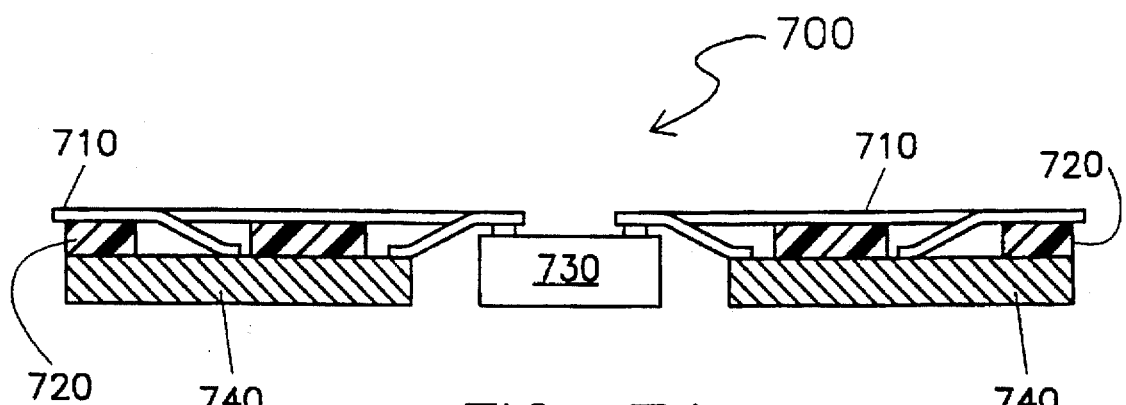

FIG. 7A shows a generalized view of a semiconductor device assembly 700 having a top patterned layer 710, a plastic film layer 720, a semiconductor die 730 and an additional conductive layer 740 (similar to 340 or 460), as set forth above, wherein the additional conductive layer 740 is formed as a square ring. (The adhesive, e.g., 350 is omitted from this view.)

Figure 7B:
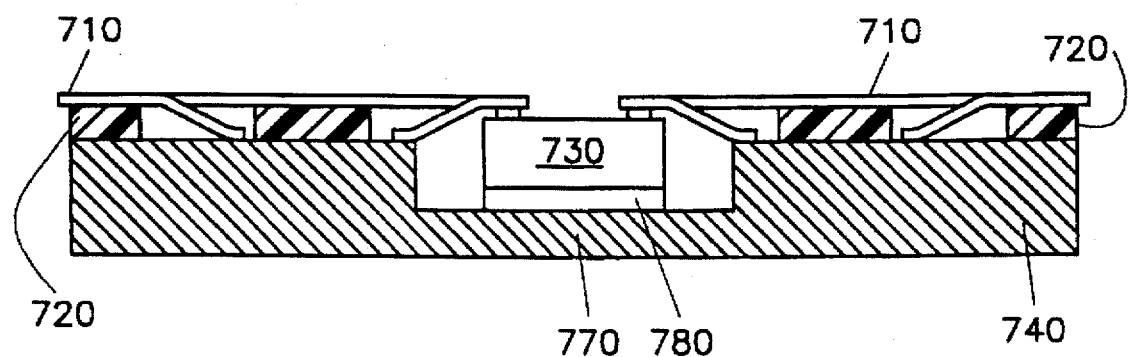

FIG. 7B shows a heat sink 770 formed integrally with the additional conductive layer 740. In essence, the heat sink is simply a flat base plate formed entirely across the bottom of the additional conductive layer 740, more particularly spanning an area directly under the die 730. A suitable thermally conductive paste 780, such as silver-epoxy, or thermal grease, is disposed between the top surface of the heat sink 770 and the bottom surface of the die 730.

Figure 7C:
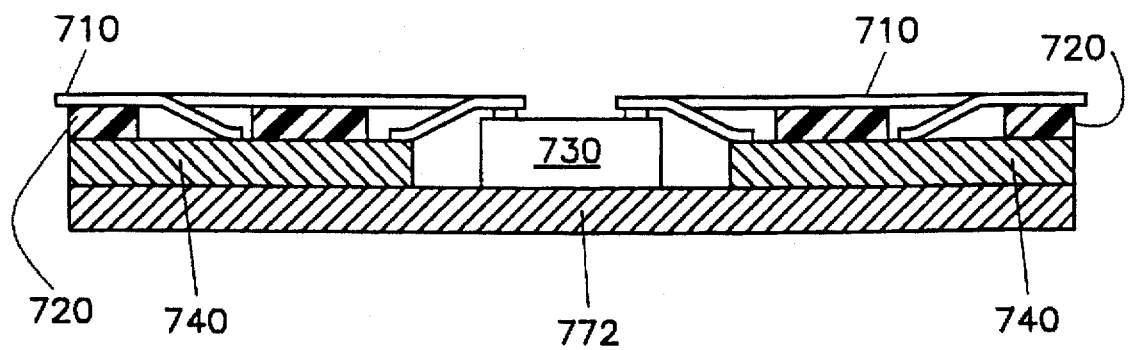

FIG. 7C simply shows that the flat base plate of the heat sink 772 can be formed separately, rather than integrally (FIG. 7B) with the additional conductive layer 740. A thermal adhesive or grease (not shown) is preferably disposed between the heat sink and the die, as in FIG. 7B. A suitable adhesive, such as epoxy, not shown, can be used to join the heat sink 772 to the additional conductive layer 740.

FIG. 7D shows a semiconductor device assembly with two additional conductive planes 740 and 760 beneath an insulating layer 720 and a signal layer 710, and including a die 730, all similar to FIG. 4A. An insulating layer (e.g., 470) between the two additional conductive layers 746 and 760 is omitted, for clarity.

In this case, the heat sink 790 is a separate base plate (similar, in this regard, to the heat sink 772 of FIG. 7C). However, the heat sink 790 is provided with a raised portion 792 sized and shaped to contact the bottom of the die 730. Thermal adhesive or grease would be used between the button 792 and the die 730. The heat sink 790 is further provided with a plurality of fins 794 on a side opposite the button 792 (away from the die 730) to aid in convective cooling of the die. The vertical arrows "↑↑↑" indicate that the heat sink 790 is being brought into contact with the die 730 and lower underlying additional conductive layer 760.

FIG. 7D also shows how the die 730 (e.g., 330, 430) is ultimately encapsulated with a glob-top epoxy 755, or the like.

What is claimed is:

1. Method of fabricating semiconductor device assembly, comprising:
    (a) providing a substrate having a conductive layer of signal traces and a plastic support layer supporting the signal traces;
    (b) locating a die in a central opening of the plastic support layer;
    (c) connecting the die to inner ends of the signal traces using a TAB process;
    (d) affixing a second conductive layer having a central opening to the non-trace side of the plastic support layer, so that an inner edge portion of the second conductive layer is exposed in the opening of the plastic support layer; and
    (e) breaking inner end portions of selected traces, one end of the inner end portions connected to the die, the other end being a free end;
    (f) bending the selected traces;
    (g) bonding the free ends of the inner end portions of the selected traces to the exposed inner edge portion of the second conductive layer;
    (h) breaking outer end portions of the selected traces, one end of the outer end portions extending beyond the plastic support layer, the other end being a free end;
    (i) bending the free ends of the outer end portions of the selected traces; and
    (j) bonding the free ends of the outer end portions of the selected traces to an exposed outer edge portion of the second conductive layer.

2. The method according to claim 1, further comprising the steps of:
    providing elongated slits through the plastic support layer near each outer edge of the plastic support layer, each slit having an inner edge and an outer edge;
    providing an extended outer edge portion of the second conductive layer into an area under the slits in the plastic support layer; and
    cutting the selected traces substantially at the inner edges of the slits, bending the cut selected traces past the plastic support layer, and bonding the cut and bent selected traces to the outer edge portion of the second conductive layer.

3. The method according to claim 1 wherein the second conductive layer is sufficiently thick to provide substantial mechanical support for the plastic layer and the conductive layer of signal traces.

4. The method according to claim 3, further comprising the step of attaching the die to the second conductive layer, wherein the second conductive layer functions as a heat spreader by removing heat from the semiconductor die.

5. The method according to claim 1, wherein the inner and outer end portions of the selected traces are bonded by tape automated bonding (TAB).

6. The method according to claim 5, wherein the inner and outer end portions of the selected traces are bonded by bumpless TAB bonding.

7. The method according to claim 5, wherein the inner and outer end portions of the selected traces are bonded by thermosonically bumpless TAB bonding.

8. The method according to claim 1 wherein the insulating layer is a first insulating layer, the method further comprising the steps of:
    providing a second insulating layer having an inner peripheral edge defining a central opening, said second insulating layer disposed on an opposite side of the second conductive layer from the plastic support layer;
    providing a third conductive layer on a side of the second insulating layer opposite the second conductive layer and extending within the central opening of the second insulating layer, an inner edge portion of the third conductive layer exposed within the opening in the second insulating layer;
    forming a second substrate by putting together the conductive layer of signal traces, plastic support layer, second conductive layer, second insulating layer and third conductive layer;
    cutting selected other traces substantially at the inner peripheral edge of the first insulating layer;
    bending the cut selected other traces past the plastic support layer, past the second conductive layer and past the second insulating layer; and
    bonding the cut and bent selected other traces to the exposed edge portion of the third conductive layer.

9. The method according to claim 8 further comprising the steps of:
    providing first elongated slits through the first insulating layer near each outer edge of the first insulating layer, each slit having an inner edge and an outer edge;
    providing an extended outer edge portion of the second conductive layer into an area under the first elongated slits in the plastic insulating layer;
    cutting the selected traces substantially at the inner edges of the first elongated slits;
    bending the cut selected traces past the plastic insulating layer;
    bonding the cut and bent selected traces to the outer edge portion of the second conductive layer;
    providing second elongated slits through the outer edge portion of the second conductive layer;

providing third elongated slits through the second insulating layer and aligned with the second elongated lists;

providing an extended outer edge portion of the third conductive layer into an area under the third elongated slits in the second insulating layer;

cutting the selected other traces substantially at the inner edges of the first elongated slits;

bending the cut selected other traces past the first insulating layer, through the second elongated slits in the second conductive layer and through the third elongated slits in the second insulating layer; and bonding the cut and bent selected other traces to the third conductive layer.

* * * * *